United States Patent [19]
Helmfrid et al.

[11] Patent Number: 5,854,870
[45] Date of Patent: Dec. 29, 1998

[54] SHORT-WAVELENGTH LASER LIGHT SOURCE

[75] Inventors: Sten Helmfrid, Musashino; Kenchi Ito, Kokubunji; Kimio Tatsuno, Tokyo; Kazumi Kawamoto, Kokubunji; Tetsuo Andou, Kokubunji; Hiroshi Momiji, Kokubunji; Osamu Komoda, Kokubunji; Hisao Kurosawa, Fukaya; Masayoshi Sato, Fukaya; Fumio Nitanda, Fukaya; Kohei Ito, Fukaya, all of Japan

[73] Assignees: Hitachi, Ltd.; Hitachi Metals, Ltd., both of Tokyo, Japan

[21] Appl. No.: 27,724

[22] Filed: Mar. 4, 1993

Related U.S. Application Data

[63] Continuation-in-part of Ser. No. 705,956, May 28, 1991, Pat. No. 5,268,912, and Ser. No. 879,361, May 7, 1992, Pat. No. 5,274,727.

[30] Foreign Application Priority Data

| May 25, 1990 | [JP] | Japan | 2-133821 |
|---|---|---|---|
| Mar. 4, 1992 | [JP] | Japan | 4-046686 |
| Apr. 2, 1992 | [JP] | Japan | 4-080675 |
| Aug. 24, 1992 | [JP] | Japan | 4-224063 |
| Feb. 3, 1993 | [JP] | Japan | 5-016149 |

[51] Int. Cl.⁶ .............. G02B 6/43; G02F 1/37
[52] U.S. Cl. .............. 385/122; 385/8; 385/37; 359/328; 372/22
[58] Field of Search .............. 385/122, 123, 385/129, 130, 131, 132, 8, 11, 31, 33, 37, 40; 359/328, 332, 326; 372/22

[56] References Cited

U.S. PATENT DOCUMENTS

| 3,464,027 | 8/1969 | De Maria | 372/26 |
|---|---|---|---|
| 3,544,916 | 12/1970 | Angelbeck | 372/18 |
| 3,665,204 | 5/1972 | Nelson | 359/328 X |
| 3,947,780 | 3/1976 | Rice et al. | 372/22 |
| 4,021,834 | 5/1977 | Epstein et al. | 385/130 |
| 4,125,860 | 11/1978 | Ishii et al. | 369/109 |

(List continued on next page.)

FOREIGN PATENT DOCUMENTS

| 277350 | 3/1990 | German Dem. Rep. |
|---|---|---|
| 1287229 | 1/1969 | Germany. |
| 3903586 | 8/1989 | Germany. |
| A-61-18964 | 1/1986 | Japan. |
| 0194376 | 8/1989 | Japan ............ 372/13 |
| A-2-63026 | 3/1990 | Japan. |

OTHER PUBLICATIONS

T.Y. Fan et al., "Nd:MgO:LiNbO₃ spectroscopy and laser devices", *J. Opt. Soc. Am. B*, vol. 3, No. 1, Jan. 1986, pp. 140–147.

A. Cordova–Plaza et al., "Miniature CW and Active Internally Q–Switched Nd:MgO:LiNbO₃ Lasers", *IEEE J. Quantum Electronics*, vol. QE–23, No. 2, Feb. 1987, pp. 262–266.

S. Wiegand Schütz, "Mit Diodenlasern angeregte Festkörperlaser", In DE–Z.: *Laser und Optoelektronik*, vol. 20, No. 3, Apr. 15, 1988, pp. 39–40.

*IEEE Journal of Quantum Electronics*, vol. QE–18, No. 3, Mar. 1982, pp. 343–351.

(List continued on next page.)

*Primary Examiner*—John D. Lee
*Assistant Examiner*—Phan T. H. Palmer
*Attorney, Agent, or Firm*—Antonelli, Terry, Stout & Kraus, LLP

[57] ABSTRACT

There is disclosed a harmonic modulation device of waveguide type including a semiconductor laser, a waveguide for generating a nonlinear optical harmonic of the semiconductor laser by keeping phase matching, means for leading an optical beam of the semiconductor laser to the waveguide, electrodes disposed on the waveguide, and means for modulating a refractive index of the waveguide electro-optically to modulate a phase matching condition and thereby modulate an intensity of the harmonic.

34 Claims, 11 Drawing Sheets

U.S. PATENT DOCUMENTS

| | | | |
|---|---|---|---|
| 4,432,613 | 2/1984 | Ueda et al. | 372/13 |
| 4,656,635 | 4/1987 | Baer et al. | 372/27 |
| 4,761,786 | 8/1988 | Baer | 372/13 |
| 4,945,539 | 7/1990 | Bagshaw et al. | 372/13 |
| 4,953,943 | 9/1990 | Miyazaki et al. | 385/122 X |
| 4,965,803 | 10/1990 | Esterowitz et al. | 372/13 |
| 4,971,416 | 11/1990 | Khanarian et al. | 385/122 X |
| 4,972,422 | 11/1990 | Tatsuno | 385/122 X |
| 4,979,176 | 12/1990 | Young et al. | 372/13 |
| 5,002,360 | 3/1991 | Colak et al. | 359/328 X |
| 5,022,729 | 6/1991 | Tamada et al. | 385/122 X |
| 5,022,731 | 6/1991 | Maerfeld et al. | 385/122 |
| 5,036,220 | 7/1991 | Byer et al. | 385/122 X |
| 5,058,970 | 10/1991 | Schildkraut et al. | 359/332 X |
| 5,061,028 | 10/1991 | Khanarian et al. | 359/332 X |
| 5,113,469 | 5/1992 | Hatakoshi et al. | 359/332 X |
| 5,157,754 | 10/1992 | Bierlein et al. | 385/122 |
| 5,179,566 | 1/1993 | Iwano et al. | 372/22 X |
| 5,274,727 | 12/1993 | Ito et al. | 385/122 |
| 5,335,303 | 8/1994 | Buchecker et al. | 359/332 X |
| 5,341,449 | 8/1994 | Chikuma | 385/122 |
| 5,349,466 | 9/1994 | Delacourt et al. | 359/326 |

OTHER PUBLICATIONS

Optics Letters/vol. 16, No. 15/Aug. 1, 1991, pp. 1156–1158.

1989 Autumn National Convention Record of Institute of Electronics, Information and Communication Engineers, C–249. No Month.

Extended Abstracts 11p–Zn–9 of the Autumn Meeting 1991, the Japan Society of Applied Physics. No Month.

IEEE Journal of Quantum Electronics, vol. 26, No. 7, pp. 1265–1276. Mar. 1982.

Journal of Applied Physics, vol. 40, No. 2, pp. 720–734. Feb. 1969.

H. Tamada, Journal of Applied Physics, vol. 70, No. 5 (May 1991), pp. 2536–2541.

N. Nishihara, "Optical Integrated Circuit", p. 178. No Month, No Year.

NTT Technique Transfer Corporation, "Study on quality improvement f oxide ferroelectric crystal", Ch. 3. Mar. 1986.

Chheng et al., Journal of Crystal Growth, vol. 112 (1991), pp. 309–315. Feb. 1991.

J.D. Bierlein et al., Proceedings of Conference on Lasers and Electro–Optics (1991), CMH13. No Month.

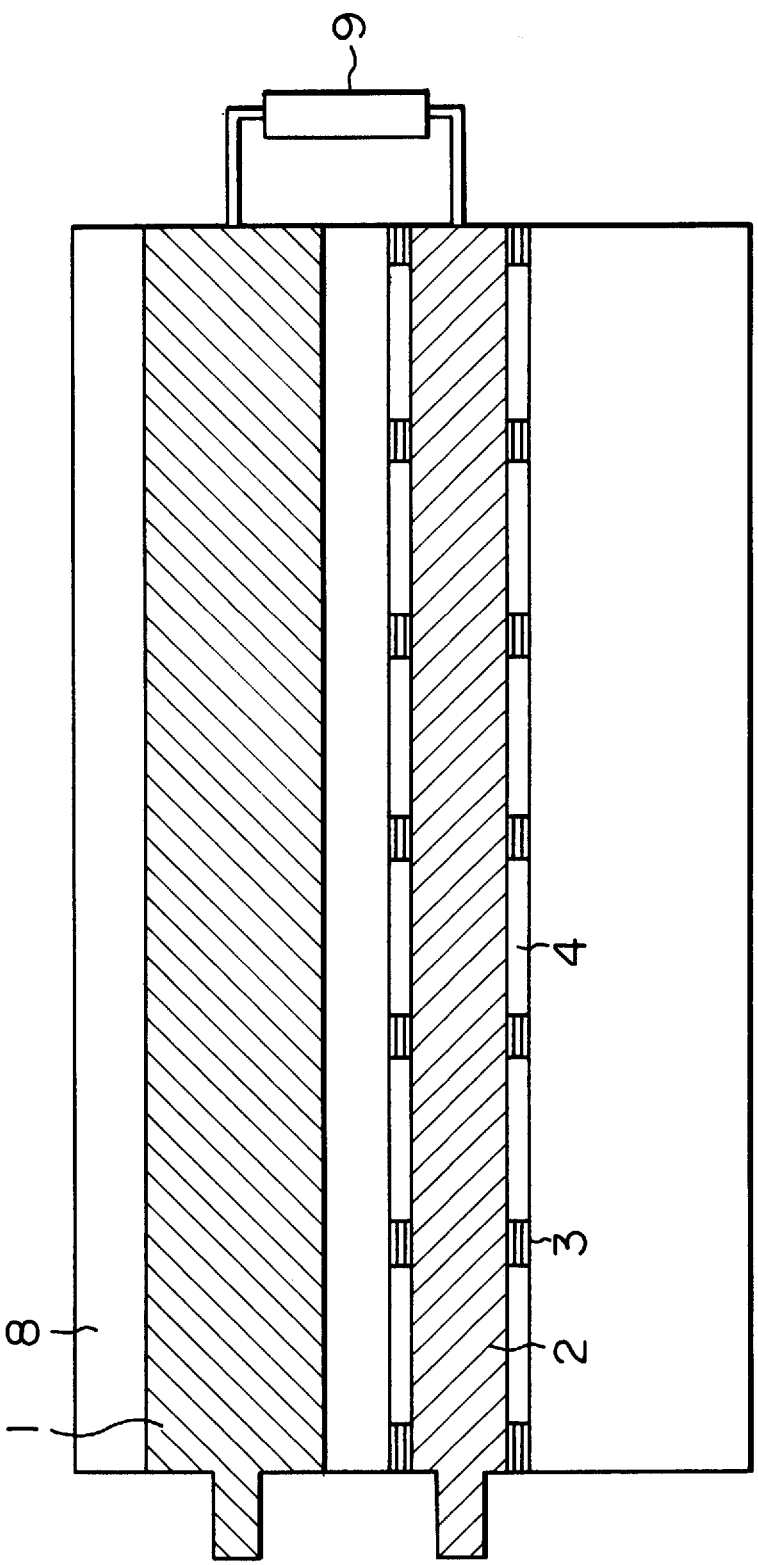

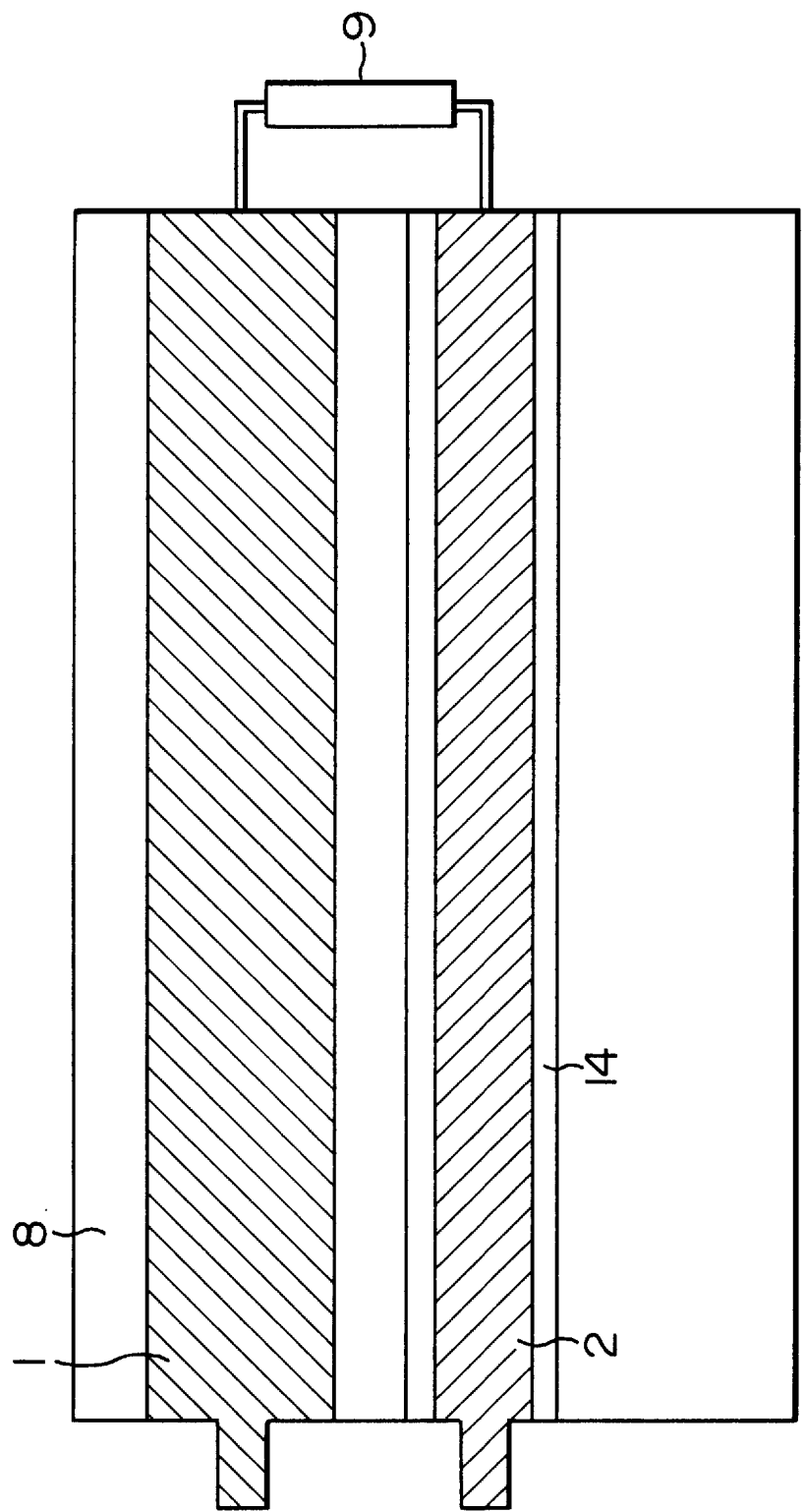

F I G. 11A
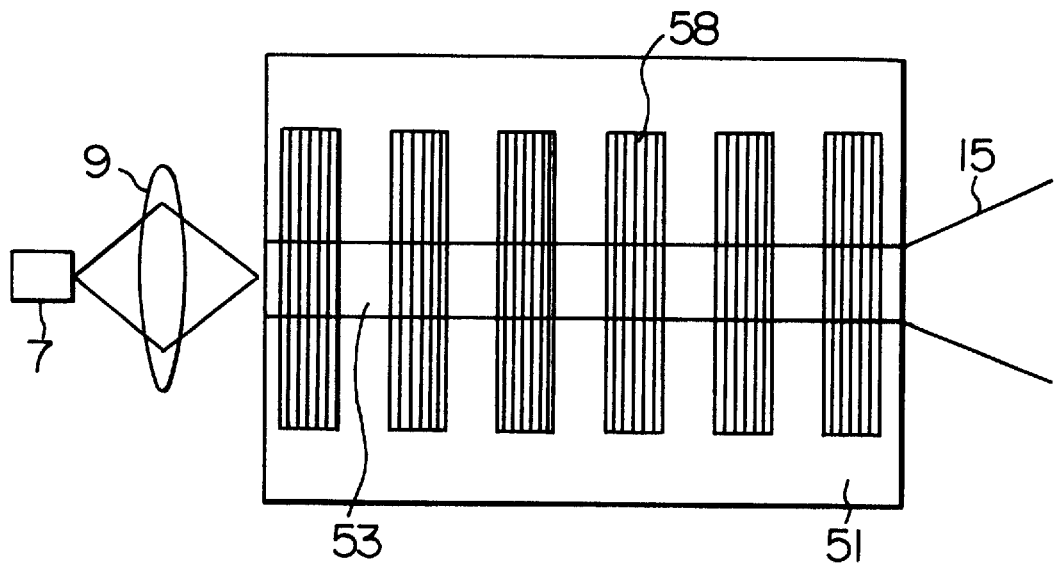
F I G. 11B
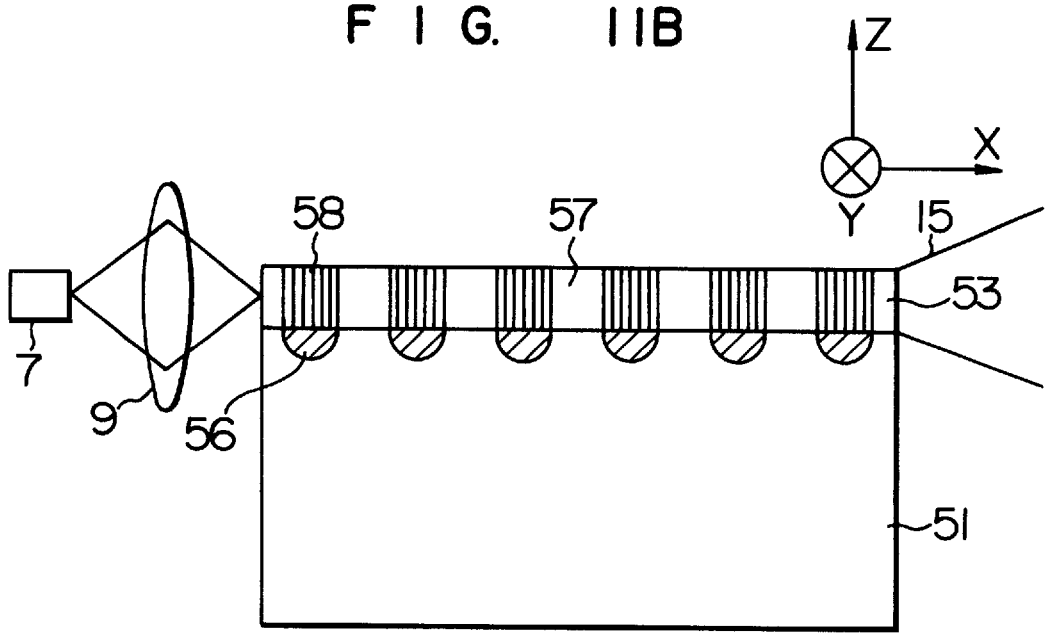

F I G. 14
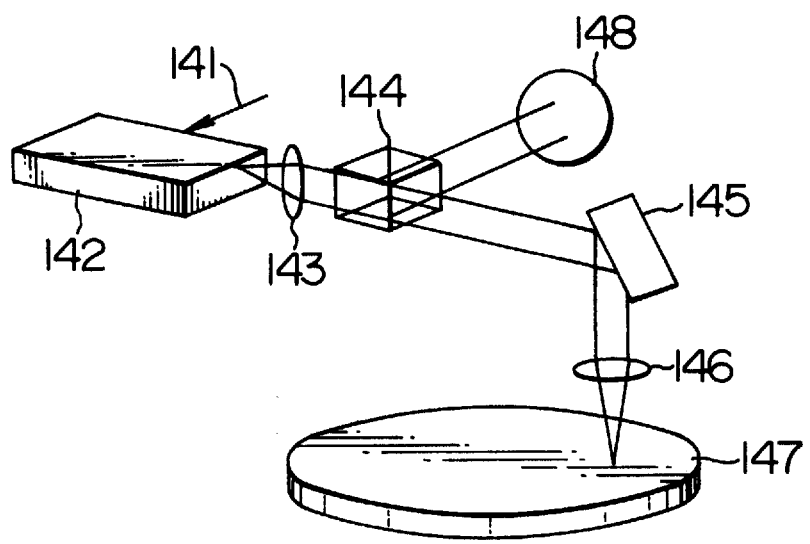
F I G. 15
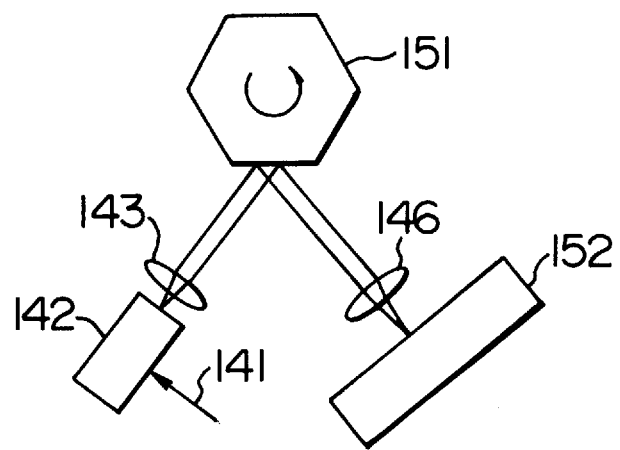

SHORT-WAVELENGTH LASER LIGHT SOURCE

CROSS-REFERENCE TO RELATED APPLICATION

This is a continuation-in-part of application Ser. No. 07/705,956 filed on May 28, 1991, now U.S. Pat. No. 5,268,912, and of application Ser. No. 07/879,361 filed on May 7, 1992, now U.S. Pat. No. 5,274,727, the disclosures of which are hereby incorporated by reference.

BACKGROUND OF THE INVENTION

The present invention relates to a short-wavelength laser light source in which semiconductor laser light having a wavelength of 800 nm is converted to blue light having a wavelength of 400 nm and then used. In particular, the present invention relates to a light source capable of stably modulating short wavelengths. The present invention especially contributes to improvement of recording density of optical information processors such as optical disk devices or improvement of printing quality of laser beam printers. Furthermore, the present invention can be applied to light sources used in medical surgical operation devices, laser machining, optical communication, and other applications.

SUMMARY OF THE INVENTION

Nowadays, attention is paid to a technique of converting semiconductor laser light (infrared light) having a wavelength of 800 nm, for example, to a second harmonic having a wavelength of 400 nm by using a nonlinear optical crystal to obtain a short-wavelength laser beam.

In optical disks allowing recording and rewriting or laser beam printers, it is necessary to effect intensity modulation upon a light beam, which is fed from a light source, at a rate of several hundred MHz according to information to be recorded and apply the light beam onto a medium for recording. In the prior art, a harmonic generation waveguide device used a method of modulating intensity of a higher harmonic by modulating the injection current of the semiconductor laser functioning as a fundamental wave. If the injection current of the semiconductor laser is directly modulated, however, the quantity of injected carriers increases or decreases. Therefore, a change in refractive index and hopping between longitudinal modes occur, resulting in a large change in output. This phenomenon becomes significant as the modulation frequency becomes higher. Therefore, the intensity modulation of the harmonic generation waveguide device formed in a nonlinear optical crystal is limited to modulation at low frequencies. Thus the fact is that its application to optical disks and laser printers which need intensity modulation at a high frequency of several hundred MHz is obstructed.

Light sources used for optical disks and laser printers must have stable output. For example, in case digital code information is to be reproduced from an optical disk, the tolerated noise level is −120 decibel/Hertz at most in terms of relative intensity noise. On the other hand, it is well known that modulation of intensity of a higher harmonic performed in a harmonic generation waveguide device by modulating the injection current of a semiconductor laser functioning as a fundamental wave causes noise exceeding a permissible level (IEEE JOURNAL OF QUANTUM ELECTRONICS, VOL. QE-18, NO. 3, MARCH 1982, p. 343-p. 351). If the injection current density in the waveguide forming the semiconductor laser changes, the refractive index changes, resulting in a change in optical path length. This causes a change in resonant wavelength of the semiconductor laser resonator, a mode hop being generated. Fluctuation is thus caused in output light, resulting in noise.

In the process for generating a higher harmonic employing nonlinear optics, the phase of the fundamental wave must be coincident with that of the higher harmonic. This condition is called phase matching condition. In case this condition is not satisfied, the efficiency of conversion of the fundamental wave to the higher harmonic abruptly drops. The "phase matching" means that the effective refractive index of the fundamental wave must be equal to that of the higher harmonic in the nonlinear optical crystal or waveguide. Since there is wavelength dispersion in the nonlinear optical crystal or waveguide, however, the width of wavelength satisfying this condition is extremely narrow. If the wavelength of the semiconductor laser functioning as the fundamental wave is changed by mode hop, therefore, the phase matching condition is violated, resulting in fluctuation of the output of the higher harmonic. Furthermore, the mode hop of the semiconductor laser causes an output change. Since the intensity of the higher harmonic is proportionate to power of the degree of high order light of the fundamental wave, fluctuation of the semiconductor laser output is amplified.

A first object of the present invention is to provide a harmonic generation waveguide device capable of providing a stable output even if intensity modulation is performed at high speed.

In accordance with the present invention, continuous oscillation is employed in the semiconductor laser and the phase matching condition is modulated without modulating the injection current in order to achieve the above described object.

To be concrete, the above described object is achieved by a harmonic modulation waveguide device including a plurality of domains having different nonlinear optical constants and electrodes for providing the domains with electric fields, a harmonic modulation waveguide device including periodic repetition of a plurality of areas having different nonlinear optical constants and electrodes for providing the areas with electric fields, a harmonic modulation waveguide device including are as having periodically decreasing nonlinear optical constants and electrodes for providing the areas with electric fields, or a harmonic modulation waveguide device including a waveguide having equal effective refractive indexes for the fundamental wave and the second harmonic and electrodes for providing the waveguide with electric fields. In particular, the above described object is achieved by modulating the refractive index of the waveguide electro-optically to modulate the phase matching condition and hence modulate the higher harmonic.

As examples of organic matters having an electro-optical effect causing a change in refractive index in response to application of an electric field, KTP (potassium titanyl phosphate), $LiNbO_3$ (lithium niobate), and $LiTaO_3$ (lithium tantalate) can be mentioned. The change of refractive index in this electro-optical effect is proportionate to the applied electric field. Therefore, it becomes possible to control the phase matching condition by applying an electric field to change the refractive index. If the applied voltage is modulated, the phase matching condition can be satisfied by modulating the applied voltage so as to make the effective refractive index of the fundamental wave equal to that of the higher harmonic. In general, dispersion of refractive index and wavelength of a nonlinear optical material must be large. Because phase matching is not violated provided that both the refractive index change of the fundamental wave and that of the higher harmonic caused by the electro-optical effect are large. Fortunately, dispersion of the refractive index caused electro-optically typically becomes larger as the wavelength of the area becomes shorter. That is to say, the refractive index change of the higher harmonic is larger than that of the fundamental wave. Furthermore, the higher harmonic occupies a narrower space as compared with the fundamental wave. As compared with the fundamental wave, therefore, the higher harmonic has an advantage in that overlap with the electric field applied through electrodes is improved and the efficiency of electro-optical effect generation is increased.

An example of configuration of a harmonic generation waveguide device using the phase matching condition will now be described. That is to say, a waveguide formed by a nonlinear optical-crystal is divided into periodic segments, and signs of nonlinear optical coefficients of segments are inverted one after another. After the phase matching conditions are thus linked over the entire waveguide and the phase matching condition is satisfied, a higher harmonic is generated (OPTICS LETTERS/ Vol. 16, No. 15/ Aug. 1, 1991, p. 1156-p. 1158). This is called first order quasi phase matching. If it is attempted to modulate the higher harmonic by changing the injection current of such a harmonic generation device, however, the phase matching condition is violated as described above and hence the higher harmonic cannot be modulated stably.

By using the present invention, it is possible to provide individual adjacent segments with electric fields differing from segment to segment. Therefore, the phase matching condition can be satisfied without canceling refractive index changes between adjacent segments. Especially, if the dimension of segments adjacent in the waveguide direction is changed, higher-order pseudomatching of phase can be achieved more sufficiently.

Furthermore, without direct modulation, the semiconductor laser can be oscillated in a single mode. As for modulation of the phase matching condition, it is conducted by using the electro-optical effect to modulate the effective refractive index of the waveguide. If effective refractive index changes of the fundamental wave and the higher harmonic caused by the electric field, which is applied through electrodes formed in the waveguide, are sufficiently large, the above described phase matching condition can be violated easily. On the contrary, if the applied electric field is turned off, the original phase matching condition is reproduced and the higher harmonic is generated.

The method for modulating the higher harmonic according to the present invention can be applied to waveguides of any type such as plane waveguides, channel waveguides, and array waveguides. Furthermore, this method can be applied to various nonlinear optical crystals such as lithium niobate, lithium tantalate, and potassium titanyl phosphate crystals, and organic compounds, having an electro-optical effect for obtaining the higher harmonic. Furthermore, this method can be applied to not only the above described pseudomatching of phase but also any phase matching such as birefringent phase matching, mode dispersion phase matching, and balance phase matching. As for the higher harmonic, this method can be applied to generation of the second harmonic, the third harmonic, and a further higher harmonic. As for electrodes formed in the waveguide, every type such as the lamp type or impedance-matched travelling wave type can be used.

In short-wavelength conversion, nonlinearity of a dielectric substance is used. That is to say, dielectric polarization P polarizes + and −. As represented by the following equation, the dielectric polarization has a term proportionate to an electric field and a term proportionate to the square of the electric field.

$$\vec{P} = x\vec{E} + x|\vec{E}|^2 \tag{1}$$

In the short-wavelength conversion, the term proportionate to the square in the equation (1) above is used for conversion to the second harmonic.

However, the refractive index of optical materials typically changes according to the wavelength. This results in a problem that the law of conservation of momentum does not hold true provided that the law of conservation of energy is satisfied. Therefore, the second harmonic cannot be extracted simply. That is to say, the electric field E of the equation (1) above is expressed by the following equation.

$$E = e^{i\omega t} \tag{2}$$

In the equation (2), $\omega$ is expressed by $$\omega = 2\pi\nu = 2\pi c/\lambda \tag{3}$$

where $\omega$ is the angular frequency, $\nu$ the frequency, c the velocity of light, and $\lambda$ the wavelength.

In the equation (3), $\lambda$ is expressed by $$\lambda = \lambda_0/n(\lambda) \tag{4}$$

where $\lambda_0$ is the wavelength in the air, $\lambda$ the wavelength in the substance, and $n(\lambda)$ the refractive index.

Therefore, the phase matching between the fundamental wave and the second harmonic, i.e., combining innumberable second harmonic components, which have been generated in the second harmonic generation device, with the same phase in the optical waveguide is being studied.

For example, in "1989 Autumn National Convention Record of Institute of Electronics, Information and Communication Engineers, C-249", a birefringent phase matching device for emitting second harmonic components is disclosed. In this device, lithium niobate doped with magnesium undergoes liquid growth on a substrate of $LiTaO_3$ (lithium tantalate) to form an optical waveguide. From one end of the optical waveguide, the fundamental wave polarized horizontally to the substrate surface (TE polarization) is inputted. From the other end of the optical waveguide, the second harmonic of vertical polarization (TM polarization) is outputted.

Furthermore, a Cerenkov phase matching device is disclosed in JP-A-61-18964. In the disclosed device, an optical waveguide is formed on a $LiNbO_3$ monocrystalline substrate by using a proton exchange method (i.e., a method of partially exchanging Li ions and protons in $LiNbO_3$). From one end of the optical waveguide, a fundamental wave polarized vertically with respect to the substrate surface is inputted. The second harmonic of the vertically polarized light generated in the optical waveguide by Cerenkov radiation-is taken out.

In Electronics, Letters, vol. 25, pp. 731–732, an SHG device using a domain inverted grating is disclosed. In this SHG device, a polarization inversion layer having spontaneous polarization directions inverted with equal pitches and an optical waveguide formed by using the proton exchange method are formed on a ferroelectric substance having spontaneous polarization such as a $LiNbO_3$ substrate. From one end of the optical waveguide, a fundamental wave polarized in the z direction is inputted. From the other end, the second harmonic polarized in the z direction is taken out.

FIGS. 5A, 5B and 5C are diagrams showing the principle of phase matching operation. In case light is propagated in the optical waveguide in the direction of an arrow as shown in FIG. 5A, the second harmonic as represented by a solid line in FIG. 5B is generated at point A, whereas the second harmonic as represented by a broken line in FIG. 5B is generated at point B. FIG. 5C shows the waveform of the fundamental wave. In this way, discrepancy occurs between waveforms of the second harmonic generated at different points in the optical waveguide.

In this way, several methods for taking out the second harmonic components in the optical waveguide have heretofore been proposed. However, the method described in aforementioned "1989 Autumn National Convention Record of Institute of Electronics, Information and Communication Engineers, C-249" has a problem described below. That is to say, the wavelength dispersion of the refractive index of $LiNbO_3$ is too large. If the wavelength of the second harmonic becomes 500 nm or less, therefore, sufficient phase matching becomes impossible and pure blue light cannot be obtained. This method also has another problem. That is to say, the temperature coefficient of the refractive index in respective polarization directions largely differs between the fundamental wave and the second harmonic. Therefore, the propagation velocity changes according to the temperature and the phase matching condition is violated. Accordingly, the permissible temperature width becomes narrow as little as approximately 0.2° C. Furthermore, as for the precision of the film thickness of the optical waveguide, an impracticable value, such as 0.1 μm or less, is needed.

The method described in the aforementioned JP-A-61-18964 also has a problem. That is to say, the second harmonic output takes the shape of a crescent moon. Since the wave aberration is large, the second harmonic output cannot be narrowed down to a minute optical spot for an optical disk device or the like.

In the aforementioned method described in Electronics Letters, the second harmonic is shut in the optical waveguide and hence the output beam can be easily narrowed down. Furthermore, the polarization direction of the fundamental wave becomes identical with that of the second harmonic. Therefore, a difference in the refractive index or its temperature coefficient due to a difference in polarization direction is not caused, and the permissible temperature width is relaxed. However, it is still insufficient for practical purposes. In addition, wavelength selectivity is severe. Even if the wavelength of the semiconductor laser changes by only 1 nm, the effect becomes zero, resulting in a problem. That is to say, the efficiency of SHG is approximately 0.6 as shown in FIG. 7 when the change $\Delta N$ of the semiconductor laser wavelength is $\pm 4 \times (1/10^5)$. When $\Delta N$ is $\pm 6 \times (1/10^5)$, the efficiency becomes approximately 0.1.

As a measure for reducing the above described wavelength variation, therefore, a method of controlling the temperature of a semiconductor laser to a range of $\pm 0.5°$ or less and using the semiconductor in a narrow portion is reported in "Extended Abstracts (the Autumn Meeting, 1991); the Japan Society of Applied Physics, 11p-ZN-9".

As another measure, a method of gradually changing the period $\Lambda$ of the domain inverted grating (polarization inversion grating) and making the bandwidth of wavelength selectivity broader is proposed in "IEEE Journal of Quantum Electronics", vol. 26, no. 7, pp. 1265–1276.

In the above described method, however, the period of a long polarization inversion grating is shifted by 1/100 or less of several microns at a time. As a matter of fact, therefore, fabrication is difficult. In addition, an extremely short portion of the polarization inversion grating contributes to generation of the second harmonic. In the remaining portion, phase deviation occurs, resulting in a problem of lowered efficiency.

In JP-A-2-63026, a polarization inversion SHG device having a modulated waveguide width is disclosed. That is to say, the wavelength selectivity is relaxed by changing the width and depth of the optical waveguide instead of changing the polarization inversion period on the $LiNbO_3$ substrate.

However, this method also has a problem that only a short portion of the optical waveguide contributes to generation of the second harmonic and hence the efficiency is largely lowered.

Recently, an SHG light source using a polarization inversion grating as shown in FIG. 6 as an external resonator has been disclosed in "Technical Report of the Institute of Electronics, Information and Communication Engineers, OQE 91–23, pp. 31–36". In FIG. 6, numeral 71 denotes a semiconductor laser and numeral 72 denotes an optical fiber. Numeral 73 denotes a lens system. An external resonator illustrated on the right side is an SHG device using a polarization inversion grating. In the SHG device, numeral 51 denotes a $LiNbO_3$ substrate, 52 an optical waveguide, and 53 a polarization inversion layer. Between the second harmonic generation device and the semiconductor laser 71, the lens system 73 and the optical fiber 72 are thus disposed to couple them. By using the optical fiber 72 and the second harmonic generation device as a laser oscillator serving also as a reflecting mirror of the output side of the semiconductor laser 71, the laser oscillation wavelength is pulled in a wavelength allowing generation of the second harmonic.

When this method is used, the laser wavelength is stabilized. However, raising the reflectance of the polarization inversion grating with respect to the laser wavelength increases the loss of the waveguide. This results in a problem of a largely lowered generation efficiency of the second harmonic.

In addition, a difference occurs between the design wavelength and the wavelength of actual operation, for example, because of various errors caused at the time of device fabrication. This results in a secondary problem that the design wavelength must be made to coincide with the actual operation wavelength by especially selecting a semiconductor laser or adjusting the temperature of the crystal.

Another object of the present invention is to solve the above described problems of conventional techniques and provide an SHG waveguide light source of internal resonance having properties of slight deterioration of efficiency η with respect to a change in laser wavelength λ, easy focusing, small wave front aberration, and easy fabrication.

In order to achieve the above described objects, an interacting waveguide type SHG light source of internal resonance type according to the present invention has the following features. (A) In a waveguide SHG light source of internal resonance type for inputting a fundamental wave component of semiconductor laser light to an optical waveguide including, in an optical substrate having spontaneous polarization, a polarization inversion portion having a periodically inverted direction of spontaneous polarization and for converting the fundamental wave component to a second harmonic, the SHG light source according to the present invention includes a diffraction grating disposed in the optical waveguide of the second harmonic output side of the polarization inversion portion to reflect the fundamental wave component of the semiconductor laser light toward the semiconductor laser; and a pair of electrodes disposed on the diffraction grating to adjust a refractive index of he optical waveguide by applying a direct current voltage through an optical transparent thin film. (B) The SHG light source further includes means disposed in an end face of the optical substrate for inputting the semiconductor laser light or between the optical substrate and the semiconductor laser to transmit only the fundamental wave of the semiconductor laser light and reflect the second harmonic of the semiconductor laser light; and means for reflecting the fundamental wave of the semiconductor laser light, the reflecting means being disposed in an end face of the optical substrate opposite to the end face for inputting the semiconductor laser light. (C) The diffraction grating is disposed, not in the optical waveguide of the second harmonic output side of the polarization inversion portion, but in the optical waveguide of the second harmonic output side of a refractive index modulation portion including a periodic repetition of a plurality of areas having different refractive indexes in the optical substrate. (D) The diffraction grating is disposed, not in the optical waveguide of the second harmonic output side of the domain inverted region, but in the optical waveguide of the second harmonic output side of a spontaneous polarization modulation portion having magnitude of periodically modulated spontaneous polarization. (E) The optical substrate is formed by using lithium niobate ($LiNbO_3$), lithium niobate doped with magnesium oxide ($LiNbO_3$:MgO), lithium tantalum niobate ($LiTaNbO_3$), or lithium tantalate ($LiTaO_3$). (F) The optical waveguide is disposed in a ferroelectric thin film having the same spontaneous polarization direction as the optical substrate has, and the diffraction grating has a periodically etched structure. (G) Means for reflecting the semiconductor laser light is disposed in an end face of the semiconductor laser opposite to the optical substrate is also disposed. (H) The polarization inversion portion and the diffraction grating have the same grating period, and a pair of electrodes disposed on the diffraction grating are disposed in parallel to a direction of light propagation in the optical waveguide. (I) An electric field obtained by applying a voltage between a pair of electrodes controls a refractive index of the diffraction grating located under the electrodes to make a Bragg wavelength of the diffraction grating coincident with a wavelength of SH light oscillated by a polarization inversion grating. (J) An electric field obtained by applying a voltage between a pair of electrodes controls a refractive index of the diffraction grating, which is located under the electrodes, to deviate a Bragg wavelength of the diffraction grating from a wavelength of SH light oscillated by a polarization inversion grating and thereby modulate an intensity of the outputted second harmonic.

In accordance with the present invention, near infrared semiconductor laser light having a wavelength 750–1100 nm, for example, is inputted to the optical waveguide on the optical substrate, and a polarization inversion portion having a periodically inverted direction of spontaneous polarization is so disposed along the optical waveguide as to be adjacent to a diffraction grating. Furthermore, a pair of electrodes are disposed on the diffraction grating via an optically transparent thin film. The semiconductor laser light incident on the optical substrate is converted to the second harmonic in the polarization inversion portion of the optical waveguide portion, an optical waveguide portion including a periodic repetition of a plurality of areas having different refractive indexes disposed in the optical substrate, or an optical waveguide portion having a periodically modulated magnitude of spontaneous polarization disposed in the optical substrate having spontaneous polarization. The remaining semiconductor laser light is reflected to the semiconductor laser light side by the adjacent diffraction grating.

Furthermore, the optical substrate is formed by disposing a nucleus of a spontaneous polarization polarization portion on one side on a substrate of a ferroelectric material such as lithium niobate ($LiNbO_3$), lithium niobate doped with magnesium oxide ($LiNbO_3$:MgO), lithium tantalum niobate ($LiTaNbO_3$), or lithium tantalate. ($LiTaO_3$), disposing a periodically etched structure on the other side, disposing over them a ferroelectric thin film having a refractive index higher than that of the optical substrate, forming in the ferroelectric thin film a polarization inversion portion having the same direction as the nucleus of the spontaneous polarization portion of the ferroelectric material substrate has, a rectangular shape, and a high aspect ratio, and using the periodic etching structure portion as the diffraction grating.

Furthermore, the reflecting means disposed in a semiconductor laser light incidence portion of the optical substrate reflects the second harmonic component of semiconductor laser and transmits the fundamental wave component. The reflecting means disposed in the end face of the semiconductor laser reflects, say, 90% or more of semiconductor laser light.

Owing to such a configuration, the second harmonic generation portion can be separated from the fundamental wave reflecting portion. Therefore, each of them can be designed in an optimum manner. Furthermore, as the output of the semiconductor laser is increased, the generation efficiency of the second harmonic can be markedly increased.

In the aforementioned "Electronics Letters, vol. 25 (1989), pp. 731–732", there is proposed a method of periodically forming a film of Ti on a substrate of a lithium niobate crystal, heating the film to approximately 1100° C., inverting the polarization of the film portion made of Ti, then producing an optical waveguide by using the proton exchange method, producing, on a ferroelectric substance having spontaneous polarization for inputting the fundamental wave and taking out the second harmonic, a polarization inversion portion having a spontaneous polarization direction inverted with equal pitches and the optical waveguide formed by using the proton exchange method, inputting, from one end of the optical waveguide, the fundamental wave polarized in the z direction, and taking, from the other-end, the second harmonic polarized in the z direction.

Furthermore, in case lithium tantalate is used for the crystal substrate, there is also proposed a method of fabricating a periodic proton exchange portion by using the proton exchange method instead of Ti diffusion, heating the periodic proton exchange portion to approximately 600° C., inverting polarization of only the proton exchange portion layer, and fabricating an optical waveguide by using the proton exchange method.

In the above described method, the polarization inversion grating is produced by diffusing Ti or conducting proton exchange. Therefore, the shape of the polarization inversion grating depends upon shapes of the Ti diffusion layer and proton exchange layer. It is essentially difficult to fabricate a polarization inversion grating having a rectangular section.

The section shape of the polarization inversion grating fabricated by using the Ti diffusion method is approximately triangular, whereas the section shape of the polarization inversion grating fabricated by using the proton exchange method is approximately semicircular. This results in a problem that the second harmonic cannot be generated with an innate efficiency in the SHG device having polarization inversion grating taking an ideal rectangular section shape.

Another object of the present invention relates to improvement of a second harmonic generation device, and in particular, is to provide a second harmonic generation device of waveguide type having an efficiency improved by bringing the section of the polarization inversion grating close to a rectangular shape, and a method for fabricating it.

In order to solve the above described problem, a second harmonic generation device including an optical substrate and a ferroelectric optical waveguide layer having polarization inversion areas periodically disposed is configured so that periodic inversion boundary lines of polarization in the optical waveguide layer may make an angle of 75°–105°, preferably 85°–95°, with a surface or interface of the optical waveguide layer. Furthermore, a cladding layer having a refractive index lower than that of the optical waveguide layer and having a width narrower than that of the optical waveguide layer is disposed on the optical waveguide layer.

Therefore, the substrate is made of lithium niobate doped with magnesium oxide, and the optical waveguide layer is made of lithium niobate or lithium niobate doped with a smaller amount of magnesium oxide as compared with the substrate. Or the substrate is made of lithium tantalum niobate, and the optical waveguide layer is made of lithium niobate or lithium tantalum niobate having a higher niobium content as compared with the substrate. The cladding layer can be made of ZnO or $SiO_2$.

Furthermore, the substrate may be made of potassium titanyl phosphate or potassium titanate arsenic phosphate, and the optical waveguide layer may be made of potassium titanate arsenate or potassium titanate arsenic phosphate having a higher arsenic content as compared with the substrate. Or the substrate may be made of potassium titanyl phosphate or rubidium potassium titanate phosphate, and the optical waveguide layer may be made of rubidium titanate phosphate or rubidium potassium titanate phosphate having a higher rubidium content as compared with the substrate. In this case, the cladding layer is made of $SiO_2$.

Furthermore, by production process including at least liquid epitaxial growth, an optical waveguide layer is formed on a substrate having polarization inversion portions periodically disposed thereon.

At this time, the film growth temperature of the liquid epitaxial growth is set to 800° C. or below, preferably 750° or below.

In case the optical waveguide layer is made of lithium niobate doped with magnesium, lithium niobate, or lithium tantalum niobate, flux used for liquid epitaxial growth is made of vanadium pentoxide, boron trioxide, lithium fluoride, potassium fluoride, vanadium pentoxide and potassium oxide, vanadium pentoxide and sodium oxide, boron trioxide and molybdenum trioxide, or boron trioxide and tungsten trioxide.

In case the optical waveguide layer is made of potassium titanate arsenic phosphate, potassium titanate arsenate, rubidium potassium titanate phosphate, or rubidium titanate phosphate, flux used for liquid epitaxial growth is made of tungsten trioxide, molybdenum trioxide, or potassium arsenic phosphate.

By choosing 75°–105°, preferably 85°–95°, as an angle formed by the periodic inversion boundary lines of polarization in the optical waveguide layer with the surface or interface of the optical waveguide layer, phase mismatch caused when the fundamental wave and the second harmonic travel in the optical waveguide layer can be compensated efficiently. As a result, generation efficiency of the second harmonic in the optical waveguide layer is improved.

Furthermore, by disposing, on the optical waveguide layer, a cladding layer having a refractive index lower than that of the optical waveguide layer and having a width narrower than that of the optical waveguide layer, light distribution can be made symmetrical in the longitudinal direction and hence light can be shut in the optical waveguide efficiently. As a result, generation efficiency of the second harmonic in the optical waveguide layer is further improved.

A substrate is made of lithium niobate doped with magnesium oxide, and an optical waveguide layer is made of lithium niobate or lithium niobate doped with a smaller amount of magnesium oxide as compared with the substrate. In a production process, an optical waveguide layer is formed on the substrate having polarization inversion portions periodically disposed beforehand thereon, by means of liquid epitaxial growth, with a film growth temperature of 800° C. or below, preferably 750° or below. Thereby, the angle formed by the periodic inversion boundary lines of polarization in the optical waveguide layer with the surface or interface of the optical waveguide layer can be made 75°–105°, preferably 85°–95°.

Alternatively, a substrate is made of lithium tantalum niobate, and an optical waveguide layer is made of lithium niobate or lithium tantalum niobate having a higher niobium content as compared with the substrate. In a production process, an optical waveguide layer is formed on the substrate having polarization inversion portions periodically disposed beforehand thereon, by means of liquid epitaxial growth, with a film growth temperature of 800° C. or below, preferably 750° or below. Thereby, the angle formed by the periodic inversion boundary lines of polarization in the optical waveguide layer with the surface or interface of the optical waveguide layer can be made 75°–105°, preferably 85°–95°.

In case the optical waveguide layer is made of lithium niobate doped with magnesium oxide, lithium niobate, or lithium tantalum niobate, flux used for liquid epitaxial growth is made of vanadium pentoxide, boron trioxide, lithium fluoride, potassium fluoride, vanadium pentoxide and potassium oxide, vanadium pentoxide and sodium oxide, boron trioxide and molybdenum trioxide, or boron trioxide and tungsten trioxide. Thereby the liquid epitaxial growth can be made.

Furthermore, in view of refractive index, ZnO or $SiO_2$ can be used for the cladding layer.

Alternatively, a substrate is made of potassium titanyl phosphate or potassium titanate arsenic phosphate, and the optical waveguide layer is made of potassium titanate arsenate or potassium titanate arsenic phosphate having a higher arsenic content as compared with the substrate. In a production process, an optical waveguide layer is formed on the substrate having polarization inversion portions periodically disposed beforehand thereon, by means of liquid epitaxial growth, with a film growth temperature of 800° C. or below, preferably 750° or below. Thereby, the angle formed by the periodic inversion boundary lines of polarization in the optical waveguide layer with the surface or interface of the optical waveguide layer can be made 75°–105°, preferably 85°–95°.

Alternatively, a substrate is made of potassium titanyl phosphate or rubidium potassium titanate phosphate, and the optical waveguide layer is made of rubidium titanate phosphate or rubidium potassium titanate phosphate having a higher rubidium content as compared with the substrate. In a production process, an optical waveguide layer is formed on the substrate having polarization inversion portions periodically disposed beforehand thereon, by means of liquid epitaxial growth, with a film growth temperature of 800° C. or below, preferably 750° or below. Thereby, the angle formed by the periodic inversion boundary lines of polarization in the optical waveguide layer with the surface or interface of the optical waveguide layer can be made 75°–105°, preferably 85°–95°.

Furthermore, in case the optical waveguide layer is made of potassium titanate arsenic phosphate, potassium titanate arsenate, rubidium potassium titanate phosphate, or rubidium titanate phosphate, flux is made of tungsten trioxide, molybdenum trioxide, or potassium arsenic phosphate. Thereby liquid epitaxial growth can be made.

Furthermore, in view of refractive index, $SiO_2$ can be used for the cladding layer.

BRIEF DESCRIPTION OF THE DRAWINGS

FIGS. 2A and 2B are respectively a top view and a sectional view of a harmonic modulation device according to the present invention;

FIG. 3 is a top view showing an example of a harmonic modulation device using birefringent phase matching according to the present invention;

FIGS. 11A and 11B are respectively a top view and a sectional view of a second harmonic generation device according to the present invention;

FIG. 14 is a configuration diagram for applying a light source according to the present invention to a light source of an optical disk device; and FIG. 15 is a diagram for applying a light source according to the present invention to a light source of a laser beam printer.

DESCRIPTION OF THE PREFERRED EMBODIMENTS

Embodiment 1

As for a first embodiment, the case where inversion segments are equal in length, i.e., the case where the wavelength conversion efficiency is higher and pseudomatching of phase of the first degree holds true will now be described. That is to say, the applied field is changed for each of adjacent segments.

Each of phase pseudomatching waveguides heretofore reported is formed on a z-cut substrate. In order to use the maximum electro-optical constant r33, an electric field must be applied vertically to the surface of the z-cut substrate. Therefore, electrodes are formed so as to overlap the waveguide. At this time, it is necessary to provide a buffer layer between the electrodes and the waveguide to prevent loss of light wave which would be otherwise caused by an evanescent wave applied to the electrodes. This buffer layer has a thickness of one hundred to several hundred nm. For this buffer, $SiO_2$ or $Al_2O_3$ is used.

Figure 1A:
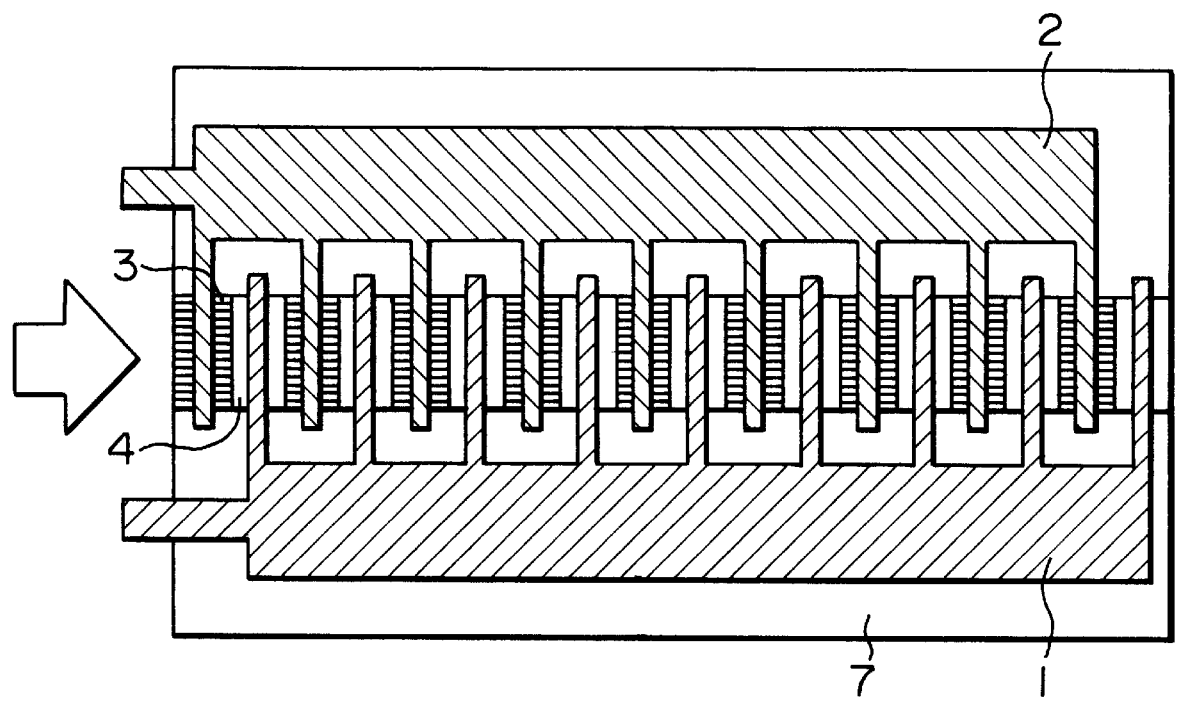
FIGS. 1A and 1B are respectively a top view and a sectional view of a harmonic modulation device using comb electrodes according to the present invention.
Figure 1B:
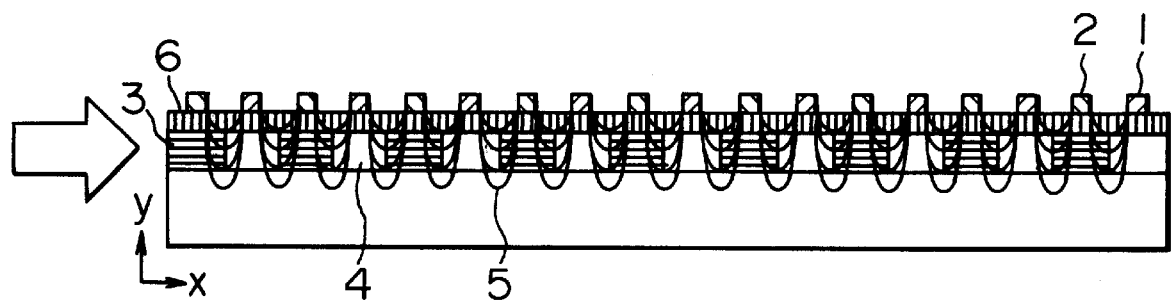

FIGS. 1A and 1B show an embodiment of the present invention. Numerals 1 and 2 denote comb electrodes for voltage application. Modulation by voltage application is conducted through the electrodes made of aluminum, for example, evaporated on the waveguide. For making electric resistance small, it is desired that the thickness of the electrodes is 3 microns or less. Numerals 3 and 4 denote domains having different signs of the nonlinear optical constant. Numeral 7 denotes a substrate. FIG. 1B shows a sectional view of the device illustrated in FIG. 1A. Numeral 6 denotes the above described buffer layer for preventing optical loss. Since electric fields which are different than each other are applied to the electrodes 1 and 2, signs of the nonlinear optical constant of the domains 3 and 4 are different and an electric field 5 is generated. That is to say, signs of the applied electric field and signs of the nonlinear optical constant are different in adjacent domains. Therefore, the induced change of effective refractive index is always constant. In the vicinity of the boundary between adjacent domains, however, almost all of the electric field is formed by the x-direction component and the y-direction component, which is the vertical component, is small. Therefore, the change of the effective refractive index is small. Therefore, the phase shift value per volt of voltage in the device for harmonic generation according to the present invention is smaller than that obtained in case lithium niobate is used for the nonlinear optical crystal and the present invention is not used. This problem can be solved by deriving an optimum value of the device according to the present invention. For example, the following study is made.

Since the device for harmonic generation is approximately 1 cm in length, electric capacitance of electrodes becomes approximately 10 pF and the modulation frequency becomes several hundred bits per second. In a phase modulator having dimensions heretofore described, the phase shift value per volt of voltage is approximately π radians. Considering that the vertical component of the electric field between electrodes is small and the phase difference between the fundamental wave and the higher harmonic needed to violate phase matching is approximately π radians, the applied voltage required for modulation is several volts.

Embodiment 2

Figure 2B:
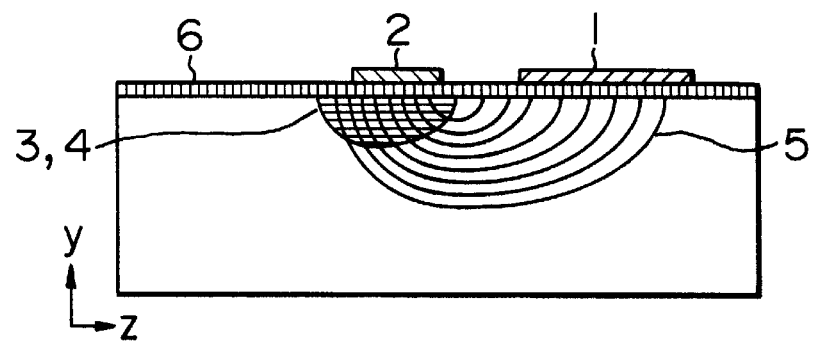

A second embodiment of the present invention is shown in FIGS. 2A and 2B. As for the second embodiment, the case where the pseudomatching of phase of the second degree holds true will now be described. In this case, adjacent segments have different lengths. By applying a uniform voltage along the waveguide, therefore, modulation becomes possible. As a modulator of traveling-wave type, high-speed modulation of at least 1 Gbit/sec becomes possible.

As shown in FIGS. 2A, domains 3 and 4 of different kinds having different widths are formed in the wavelength direction. Over the domains, an electrode 2 is formed. Another electrode 1 is so formed as to be parallel to the electrode 2. Different electric fields are applied between the electrodes 1 and 2. In this example, sizes of the domains 3 and 4 having different signs are different. (In the present embodiment, domain 3: domain 4=1:3 in length in the wavelength direction.) Therefore, cancellation of phase shift due to difference in sign of the nonlinear optical constant is not caused.

FIG. 2B shows a sectional view of the device of FIG. 2A seen in a direction perpendicular to the waveguide. The electric field between the electrodes 1 and 2 is applied as indicated by 5. The z-direction components of the electric field applied to the domains 3 and 4 are small and a large change of the effective refractive index can be obtained. In this case, the diffraction grating of waveguide type formed by the domains 3 and 4 are used as a diffraction grating of the second degree.

In this example, lithium tantalate is appropriate to materials. Because domains tend to be of laminar shapes and the permissible error from the design value in the course of the process is larger for lithium tantalate as compared with lithium niobate. Design is prepared so that the metal electrodes may be 50 ohms in impedance and terminated (modulator of traveling-wave type). The frequency band of the modulator of traveling type depends not on the impedance of the electrodes but on speed deviation between radiowaves and light waves. Therefore, modulation of several Gbits per second becomes possible. In order to make the difference between the induced effective refractive index values sufficiently large, widths of the electrodes must be set so that overlap of the electrodes with the fundamental wave may be made small and overlap of the electrodes with the harmonic may be made large. In this example, phase matching of high degree is used. As compared with the first embodiment, efficiency of conversion to the higher harmonic is low. However, the second embodiment has the advantage of a simple electrode structure and a high modulation frequency.

The configuration heretofore described can solve the problem that the refractive index changes are canceled even if an electric field is applied to segments having nonlinear optical constants of different signs in case the segments have equal length.

Embodiment 3

As a third embodiment, an example of phase matching of balance type using KTP will now be described. Shapes are nearly identical with those of the embodiment shown in FIGS. 2A and 2B. Therefore, the third embodiment will be described by referring to FIGS. 2A and 2B. Numeral 8 denotes a KTP substrate, for example. Numerals 3 and 4 denote refractive index segment waveguides having mutually different refractive indexes formed by using the Rb (rubidium) ion diffusion method. The present embodiment does not need the comb electrodes having periodically inverted signs of the nonlinear optical constant as used in the embodiment 1. Because the sign of the electro-optical constant is not modulated in the waveguide having a refractive index segment structure. Therefore, electrodes 1 and 2 can be similar in shape to those of the embodiment 2. However, the spacing between the electrodes slightly differs from that of the embodiment 2 because of difference in permittivity between KTP and $LiTaO_3$. Furthermore, a buffer layer between the optical waveguide and the electrodes is needed in the same way as the embodiments 1 and 2 to prevent light loss due to metal electrodes. In the present embodiment, the difference in refractive index between the waveguides 3 and 4 having different refractive indexes is desired to be small in order to suppress the reflection of the refractive index segments.

Embodiment 4

As a fourth embodiment, an example for achieving phase matching by making the nonlinear optical constant periodically small will now be described. Shapes are nearly identical with those of the embodiment shown in FIGS. 2A and 2B. Description will be given by referring to FIGS. 2A and 2B.

Numeral 8 denotes a $LiNbO_3$ substrate, for example. Numerals 3 and 4 denote a part which has undergone proton exchange and a part which has not undergone proton exchange, respectively. A part 3 which has undergone proton exchange has a nonlinear optical constant which is smaller than (half of, for example) that of a part 4 which has not undergone proton exchange. By the proton exchange, the electro-optical constant of the area 12 also becomes small at the same time. If a uniform electric field is applied to the parts 12 and 13, therefore, the induced refractive index change becomes larger in the part 13. Since the sign of the electro-optical constant does not change, however, the cancellation of phase shift which poses a problem in the embodiment 1 is not caused. Therefore, the electrodes 1 and 2 can have a structure of traveling-wave type in the same way as the embodiments 2 and 3. Shapes of electrodes are nearly identical with those of the embodiment 2. However, the spacing between the electrodes slightly differs from that of the embodiment 2 because of difference in permittivity of the substrate. Furthermore, a buffer layer between the optical waveguide and the electrodes is needed in the same way as the embodiments 1, 2 and 3 to prevent light loss due to metal electrodes.

Embodiment 5

FIG. 3 shows a fifth embodiment of the present embodiment. As the fifth embodiment, an example of use of birefringent phase matching will now be described.

Numeral 8 denotes a $LiNbO_3$ substrate, for example. Numeral 14 denotes an optical waveguide fabricated by using the titanium thermal diffusion method, for example. A small-sized neodymium YAG laser is appropriate as the excitation light source. For stabilizing the output SHG and making it possible to shift the wavelength of the fundamental wave, the substrate temperature must be controlled. In the present embodiment, modulation of the nonlinear optical constant is not needed and hence the electrode structure of traveling-wave type can be used. The electrode structure is similar to that of the embodiments 2 to 4. Furthermore, a buffer layer between the optical waveguide and the electrodes is needed in the same way as the embodiments 1 to 4 to prevent light loss due to metal electrodes.

As heretofore described, the present invention makes modulation of the injection current of semiconductor laser unnecessary. Therefore, it becomes possible to avoid mode pop noise generated by modulation. Accordingly, the conventional problem of amplification of semiconductor laser noise attendant upon occurrence of higher harmonic is solved. It is thus possible to provide a light source which yields a short wavelength and which operates stably.

Embodiment 6

Figure 4A:
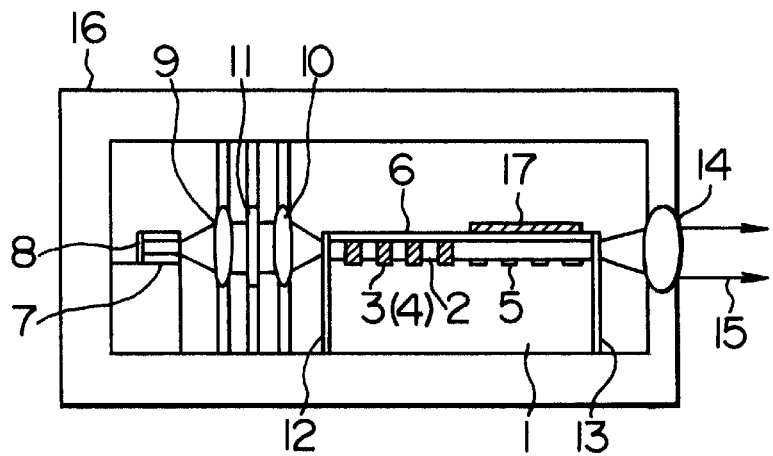
FIGS. 4A and 4B are respectively a side sectional view and a top view of a waveguide SHG light source of internal resonance type showing an embodiment of the present invention.
Figure 4B:
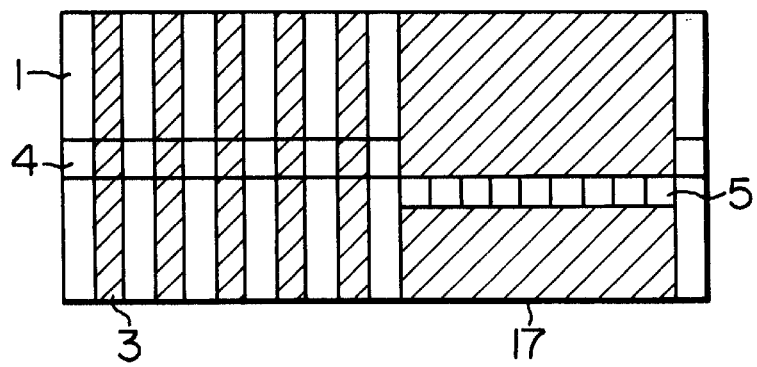
Figure 5A:
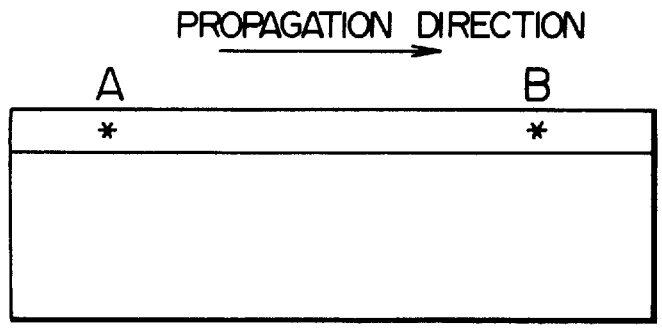
FIGS. 5A, 5B and 5C are diagrams for illustrating the principle of phase matching.
Figure 5B:
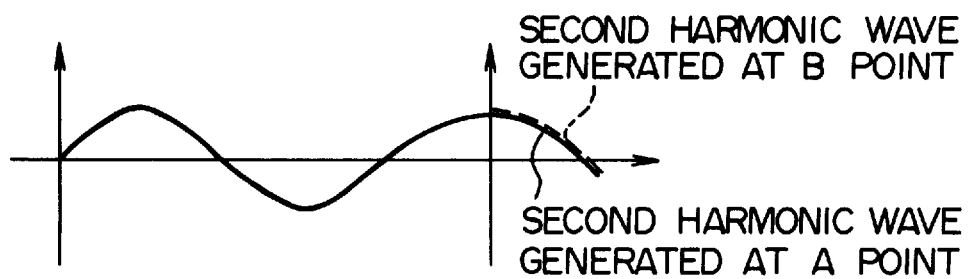
Figure 5C:
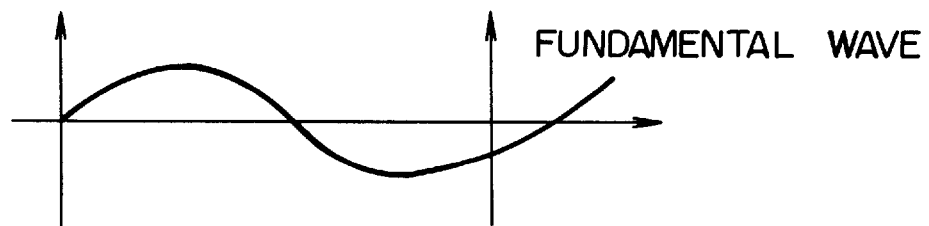

FIGS. 4A and 4B are a sectional view of a waveguide SHG light source of internal resonance type showing an embodiment of the present invention and a top view of a device portion seen from above, respectively.

In FIG. 4A, numeral 7 denotes a semiconductor laser, 9 a collimating lens system, 11 a polarizing plate, 10 a condensing lens system, 12 a coating film, 3 a polarization inversion portion, 2 a LiNbO$_3$ monocrystalline thin film, 5 a diffraction grating, 6 a guard film, 1 a substrate, 17 an electrode, 13 a coating film, 14 a collimating lens, 15 a second harmonic component, and 16 a holder. Light emitted from the semiconductor laser 7 is inputted to an end face of an optical waveguide portion 4 disposed in the substrate 1 via the collimating lens system 9, the polarizing plate 11, and the condensing lens system 10.

Figure 6:
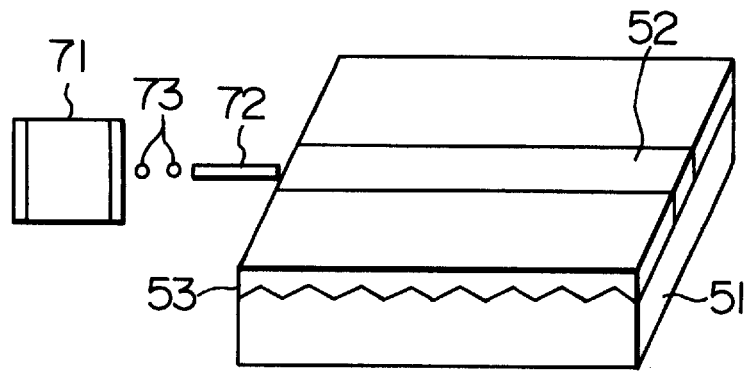
FIG. 6 is an oblique view of a conventional second harmonic generation device of polarization inversion grating resonance type.
Figure 7:
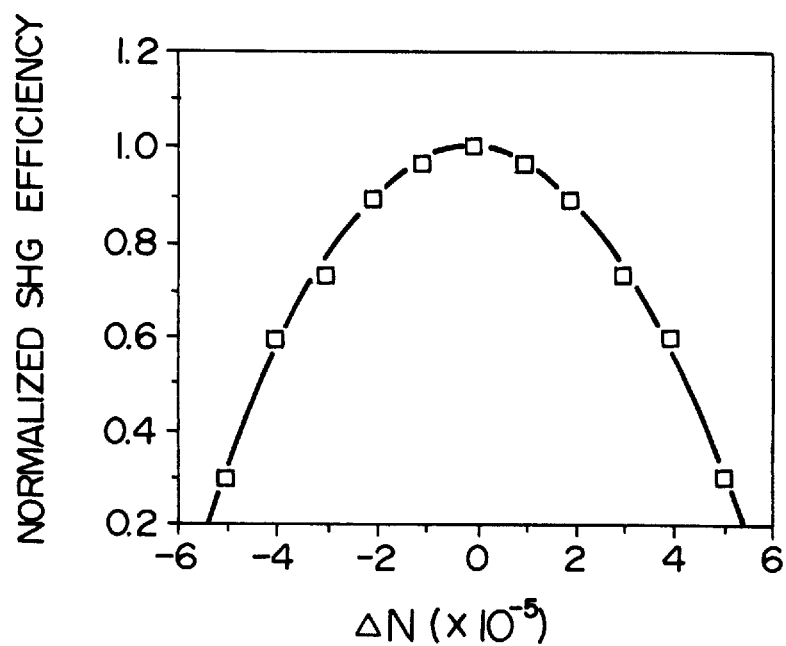
FIG. 7 is a diagram showing the relation between a change of effective refractive index and efficiency of a conventional device using a polarization inversion grating.

Making a comparison between the SHG light source shown in FIGS. 4A and 4B and the conventional light source shown in FIG. 6, the collimating lens system 9, polarizing plate 11, and condensing lens system 10 shown in FIG. 4A correspond to the optical fiber 72. The optical waveguide portion 4 in the substrate 1 shown in FIG. 4A corresponds to the external resonator of FIG. 6. Even if the collimating lens system 9, polarizing plate 11, and condensing lens system 10 are replaced by an optical fiber, the operation and effect of the present invention do not change.

On the other hand, the polarization inversion portion 3 and the diffraction grating 5 are disposed in the substrate 1 along the optical waveguide portion 4. Laser light (fundamental wave) is converted to the second harmonic by the polarization inversion portion 3 and reflected toward the fundamental wave side by the diffraction grating 5. On the basis of the propagation characteristics between the semiconductor laser 7 and the diffraction grating 5, the oscillation wavelength (wavelength of the fundamental wave) λ of the semiconductor laser 7 is determined. That is to say, this portion functions as a resonator of the semiconductor laser 7.

On the other hand, the polarization inversion grating 53 in the conventional structure of FIG. 6 plays the role of the diffraction grating 5, too. Therefore, the device of FIG. 6 has a simpler structure. However, the device of FIG. 6 has a problem that it is difficult to increase the second harmonic conversion efficiency η and reflectance for the fundamental wave simultaneously.

In the structure of the present invention shown in FIGS. 4A and 4B, the second harmonic generation portion can be separated from the fundamental wave reflecting portion by adding the diffraction grating 5 to the polarization inversion portion 3. Therefore, each of the second harmonic generation portion and the fundamental wave reflecting portion can be designed in an optical manner. Furthermore, the oscillation frequency of the semiconductor laser 7 changes so as to follow the temperature change of the diffraction grating 5 added to the polarization inversion portion 3. Therefore, the permissible frequency deviation width can be widened.

In the device of FIG. 6 as well, the permissible frequency deviation width can be widened. In the device of FIG. 6, however, reflectance for the fundamental wave is low. Therefore, the degree of coupling between the semiconductor laser 71 and the polarization inversion grating 53 becomes weak. As a result, the tracking capability for temperature change of the laser oscillation frequency is poor. Furthermore, in the device of FIG. 6, the temperature of the optical fiber 72 does not track that of the polarization inversion grating 53. This results in a problem that the tracking capability for temperature change of the laser oscillation frequency is degraded by the temperature change of the optical fiber 72.

In the SHG light source of FIGS. 4A and 4B, a pair of electrodes 17 are so disposed on the diffraction grating 5 via an optically transparent thin film as to be parallel to the optical waveguide 4 as shown in FIG. 4B. By applying an electric field to the electrodes 17, the effective refractice index of waveguide light propagating on the diffraction grating 5 can be changed and the Bragg wavelength (i.e., wavelength maximizing the reflection to the diffraction grating) of the diffraction grating 5 can be changed. Even if the second harmonic generation wavelength is deviated from the laser oscillation wavelength because of device fabrication error, therefore, they can be made coincident with each other by applying a voltage.

The device portion will now be described in detail by referring to FIG. 4B. The substrate 1 is a Z-cut LiNbO$_3$ monocrystalline substrate doped with 1 mo 1% of MgO. The surface of the substrate 1 is a +c face. On the substrate 1, the LiNbO$_3$ monocrystalline thin film 2 typically having upward spontaneous polarization is provided. In the substrate, the polarization inversion portion 3 and the diffraction grating 5 having a downward polarization direction are provided. The top of the thin film 2 is protected by the guard film 6. The optical waveguide 4 is produced by using proton exchange.

Each of LiNbO$_3$ and LiTaO$_3$ single crystals is a ferroelectric crystals belonging to a space group R3C. The sign of the nonlinear optical coefficient is periodically inverted so as to be coincident with the direction of the above described spontaneous polarization. (This is described in "Journal of Applied Physics", Vol. 40, No. 2, pp. 720–734.) It is now assumed that the polarization inversion portion 3 has a period Λ and the diffraction grating 5 has a period Λr.

The semiconductor laser 7 has a reflecting film 8 at one end thereof. Due to reflection by this reflecting film 8, light is propagated in one direction, rotated by 90 degrees in polarization direction by the polarizing plate 11, and inputted to the polarization inversion portion 3.

In the polarization inversion portion 3, laser light (fundamental wave) is converted to the second harmonic. The coating film 12 transmits the fundamental wave and reflects the second harmonic light. The fundamental wave component outputted from the polarization inversion portion 3 is reflected by the diffraction grating 5 and fed back toward the semiconductor laser 7. The semiconductor laser 7 is oscillated at a wavelength of 830 nm, for example.

Furthermore, the second harmonic component 15 outputted from the polarization inversion portion 3 is transmitted through the coating film 13 for preventing its reflection and the collimating lens 14 and outputted.

Each of the above described optical components is positioned by the holder 16 and mounted so as to be compact.

It is also possible to make the grating period of the polarization inversion portion 3 equal to that of the diffraction grating 5.

Characteristics of the device of the present invention will hereafter be described logically.

A change ΔN in effective refractive index of the polarization inversion portion 3 is caused by a change in wavelength. In this case, dependence of the refractive index n of a matter on wavelength in the visible light area follows the Sellmeier equation. As an example, the dependence for LiNbO$_3$ doped with 5 mo 1% MgO is expressed by $$n^2 = A_1 + A_2/(\lambda^2 - A_3) - A_4 \lambda^2 \quad (\lambda : nm) \tag{5}$$

where $A_1 = 4.57$ $A_2 = 9.10 \times 10^4$ $A_3 = 2.14 \times 10_2$ $A_4 = 3.0 \times (1/10^8)$ Values of A1 to A4 are values for the refractive index ns of the substrate 1 (FIG. 1) obtained by measurement using a Ti-sapphire laser, dye laser, and argon laser.

Deriving $\Delta N$ for a deviation $\Delta \lambda$ from the design wavelength $\lambda_0 = 830$ (nm) by using the value of the equation (5), the following equation (6) is obtained.

$$\Delta N = -4.24 \times (1/10^4) \Delta \lambda \quad (6)$$

$(\Delta \lambda : \text{nm})$

For keeping the efficiency of at least 80% of the maximum value in the SHG device having a length of 10 mm, $\Delta N$ must be made $2.5 \times (1/10^5)$ or less. Converting this into $\Delta \lambda$ by using the equation (6), it is found that $\Delta N$ must be limited to 0.043 nm or less. However, the wavelength of semiconductor laser changes typically on the order of 1 nm. Therefore, it is almost impossible to satisfy such a condition.

In accordance with the present invention, therefore, the oscillation wavelength of the semiconductor laser 7 is locked by using the diffraction grating 5 as described before. At the same time, a change in injection current value of the semiconductor laser 7 and longitudinal mode hopping are prevented.

Figure 8:
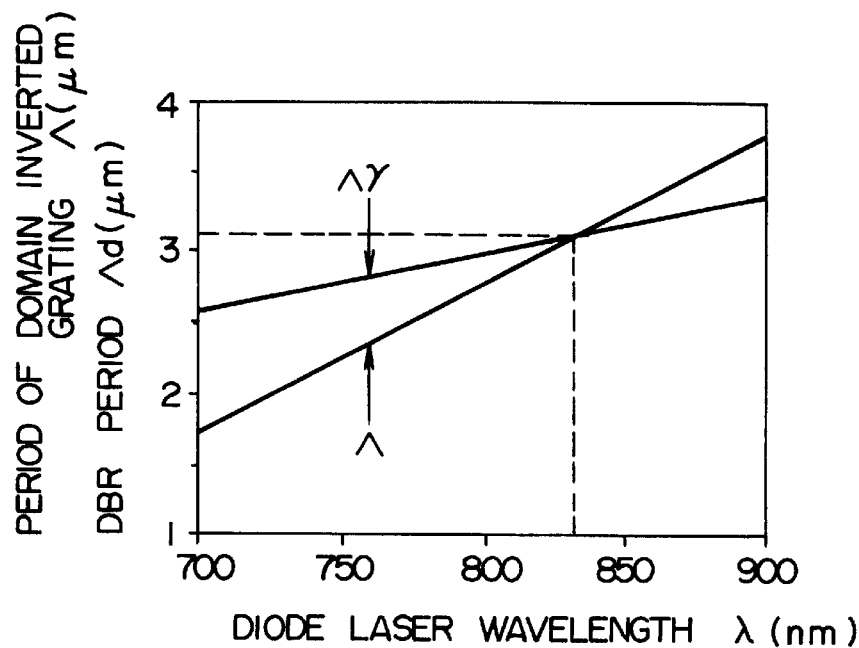
FIG. 8 is a diagram showing the relation between the polarization inversion period or diffraction grating period of the device shown in FIGS. 4a and 4b and semiconductor laser wavelength.

FIG. 8 is a diagram showing the dependence of the period $\Lambda$ of the domain inverted region (polarization inversion portion) and the period $\Lambda r$ of the diffraction grating upon the oscillation wavelength $\lambda$ of the semiconductor laser. In FIG. 8, an upper solid line represents the period $\Lambda r$ of the diffraction grating and a lower solid line represents the period $\Lambda$ of the polarization inversion portion. The solid lines intersect at one point.

The period $\Lambda r$ of the diffraction grating 5 is represented by the following equation (7). In this equation, q is an integer indicating the order of diffraction.

$$\Lambda r = \lambda/(2N) \times q \quad (7)$$

N is an effective refractive index of waveguide light.

Supposing that q=1 and $\lambda = 0.83$ μm, $\Lambda r$ becomes 0.19 μm, which makes fabrication difficult. In the present embodiment, therefore, values q=17 and $\Lambda = \Lambda r = 3.2$ μm are set.

The complex reflectance r of the diffraction grating 5 is given by the following equation (8). In this equation, $\delta$ is deviation from the Bragg diffraction wave number.

$$r = [-ik \tanh(\gamma Lb)]/[\gamma + (\alpha/2 + i\delta) \tanh(\gamma Lb)] \quad (8)$$

Where k=coupling coefficient $\alpha$=light loss coefficient of optical waveguide Lb=length of diffraction grating $\delta$=deviation from Bragg wave number $\gamma = [(\alpha/2) + i\delta]^2 + k^2$ The reflection coefficient of the diffraction grating 5 is represented by $R = |r|^2$. In case $\delta = 0$ satisfying the Bragg condition, the maximum value $R_0$ expressed by the following equation (9) is taken.

$$R_0 = \frac{k^2 \tanh^2\left(\sqrt{k^2 + (\alpha/a)^2} \cdot Lb\right)}{\left(\sqrt{k^2 + (\alpha/2)^2} + (\alpha/2) \cdot \tanh\left(\sqrt{k^2 + (a/2)^2} \cdot Lb\right)\right)^2} \quad (9)$$

The coupling coefficient k is represented by the following equation (10). In case q=17 and h=0.1 μm, we get k=7.05 × $(1/10^4)(1/\mu m)$. (See "Optical integrated circuit", by Nishihara, Haruna and Suhara, OHM SHA LTD., p.77, for example.)

$$k = 0.1199 \ (h/q) \ (1/\mu m) \quad (10)$$

$(h : \mu m)$

Figure 9:
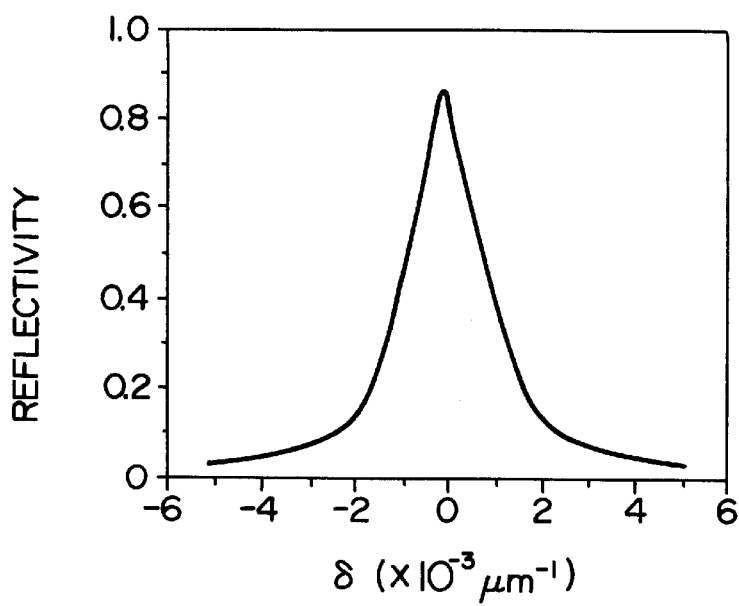
FIG. 9 is a diagram showing the relation between the reflectance of a diffraction grating of the device shown in FIG. 4 and deviation from the Bragg condition.

FIG. 9 is a diagram showing the relation between the reflectance and deviation of wave number from Bragg diffraction.

Assuming that the optical propagation loss of the optical waveguide 4 in FIGS. 4A and 4B is approximately 0.8 dB/cm and the length of the diffraction grating is Lb=2600 μm, its reflectance R is derived as shown in FIG. 9.

In FIG. 9, the reflectance R at $\delta = 0$ is 0.875 when the Bragg condition is satisfied. The range of $\delta$, in which the value of the reflectance R is kept at a value of at least 80%, is ±0.001.

Deriving the permissible variation width $\Delta \lambda$ of laser wavelength from the half-width of the above described R, it becomes approximately ±0.1 nm, resulting in favorable wavelength selectivity. Therefore, the oscillation wavelength of semiconductor laser is pulled in nearly this range and stable oscillation of the second harmonic can be realized.

Furthermore, the generation efficiency $\eta$ of the second harmonic can also be made markedly as compared with the conventional device of FIG. 6.

A first reason is that the diffraction grating 5 needed as the external resonator of the semiconductor laser 7 is separated from the polarization inversion portion 3 and hence the polarization inversion portion 3 can be fabricated so that the light propagation loss may be reduced.

A second reason is that the polarization inversion portion 3 can be fabricated so that the generation ratio of the second harmonic may be increased taking no account of the reflectance for the fundamental wave. As a result, it is possible to use a polarization inversion grating having a rectangular shape and a high aspect ratio made by using the liquid epitaxial growth method.

A third reason is that the polarization inversion portion 3 is disposed midway between the semiconductor laser 7 and the diffraction grating 5 and hence the second harmonic is generated in both the forward path and backward path of the fundamental wave.

A fourth reason is that the second harmonic is reflected by the coating film 12 and outputted from the coating film 13 almost generation e it contributes to the generation efficiency $\eta$ of the second harmonic.

On the basis of the results of study heretofore described, experiments of oscillation characteristics of the waveguide SHG light source of internal resonance type according to the present invention were made. Results of the experiments will now be described.

A GaAlAs semiconductor laser of stripe type was used. When the reflectance of the output mirror was 10% and the reflectance of the rear reflecting mirror was 90%, the GaAlAs semiconductor laser exhibited the highest output of 100 mW for the input current of 200 mA. When the reflectance of the rear mirror 8 (see FIG. 4A) was still 90% and the output side was coated with z reflection preventing film, an extremely strong second harmonic output of 40 mW having a wavelength of 410 nm (blue) was obtained with threshold values of approximately 50 mA and 200 mA.

For input of nearly the same level, the output of the conventional SHG device was approximately 2.0 mW. As compared with this, the present invention increased the output level of the second harmonic to approximately 20 times. This output level can be further raised by optimizing structures of the reflecting film 8, coating film 12, and external resonator.

In case of FIGS. 4A and 4B, the diffraction grating 5 has a structure obtained by effecting working upon the substrate 1, i.e., a so-called relief structure. However, completely the same effect is obtained even if a diffraction grating of refractive index modulation having a periodically modulated refractive index of the waveguide 4 is used.

The effect of correction of the pull-in wavelength made by the electrode 17 as shown in FIGS. 4A and 4B will now be described.

As described before by referring to the equation (6), the wavelength band of the fundamental wave used by the polarization inversion grating 3 to generate the second harmonic is extremely narrow and has a value of ±0.043 nm. In case various fabrication errors have occurred in the device production process, for example, the pull-in wavelength of the semiconductor laser pulled-in by the diffraction grating may deviate from the wavelength of second harmonic generation. By applying direct current voltage to the electrode 17, therefore, it is possible to correct the effective refractive index of waveguide light propagated on the diffraction grating 5 and adjust the pull-in wavelength.

A change $\Delta N$ in effective refractive index caused by voltage application to the electrode 17 can be represented by $$\Delta N = -(1/2)n^3 \Gamma rV/g \tag{11}$$

where r is an electro-optical coefficient. In case of $LiNbO_3$, for example, the coefficient r has a value of 30.8 pm/V. In the equation (11), n is a refractive index of the optical waveguide 4, V applied voltage, and g an electrode distance. $\Gamma$ is a coefficient representing the overlap of the electric field of the waveguide light with the electric field of the applied electric field. Depending upon the disposition of the electrodes 17 and the optical waveguide 4, $\Gamma$ has a value of 0.3 to 0.7. By applying the voltage of ±5 V of TTL level, therefore, the oscillation wavelength can be corrected by approximately 0.5 nm, for example. If a voltage of nearly 50 V is applied, a substantial correction of ±5 nm is also possible.

On the contrary, if the pull-in wavelength of the semiconductor laser coincides with the wavelength of the second harmonic generation, the intensity of the outputted second harmonic can be modulated by voltage application. That is to say, the output of the second harmonic becomes almost zero if the wavelength of the semiconductor laser deviates from a predetermined wavelength by only 0.15 nm as described before. If the wavelength of the semiconductor laser is shifted by 0.5 nm by applying the above described voltage of ±5 V of TTL level, therefore, the output of the second harmonic can made zero. Furthermore, by adjusting the voltage value to change the refractive index of the fundamental wave, an arbitrary intensity of the second harmonic can be obtained in accordance with the equation (6).

Embodiment 7

FIGS. 10A–10H are production process diagrams of an SHG light source showing an embodiment of the present invention.

Figure 10A:
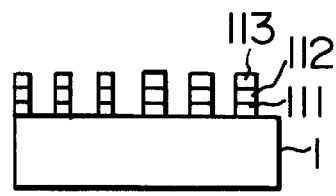
FIGS. 10A–10H show production processes of a waveguide SHG light source of internal resonance type showing an embodiment of the present invention.

Referring first to FIG. 10A, on the $LiNbO_3$ substrate 1 doped with 1 mol % of MgO, a Ti film 111 of 5 nm and a Cr film 112 of 100 nm are successively formed by sputtering. Over the films, a photoresist pattern 113 is generated by the typical photolithography technique. The Cr film 112 and Ti film 111 are successively etched and the photoresist is removed.

The left side of this Cr/Ti pattern corresponds to the polarization inversion portion 3. Its period is decided to be 3.2 $\mu$m. Considering the blurring caused by diffusion, the line/space ratio has been set to 2:8. The right side corresponds to the diffraction grating 5. Its period is 3.1 $\mu$m, and its line/space ratio is 1:1.

Figure 10E:
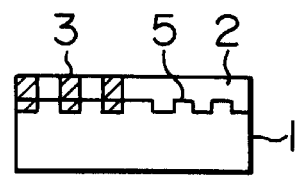
Figure 10B:
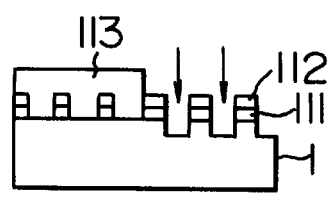

As shown in FIG. 10B, the polarization inversion portion 3 is then covered by the photoresist 113 and thereafter the $LiNbO_3$ substrate 1 is etched by ion milling to form the diffraction grating 5.

Figure 10F:
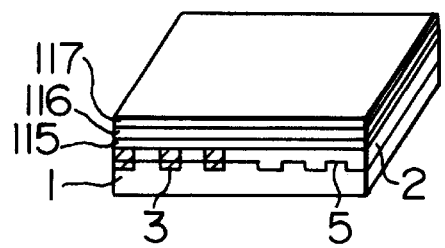
Figure 10C:
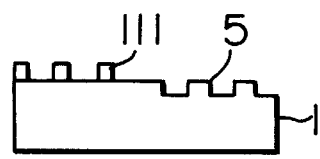

As shown in FIG. 10C, the Cr film 112 and the Ti film 111 of the polarization inversion portion 3 are then removed by etching. Thereafter the polarization inversion portion 3 is covered by the photoresist, and the Ti film 111 of the polarization inversion portion 3 is generated. The photoresist is removed by etching.

Figure 10G:
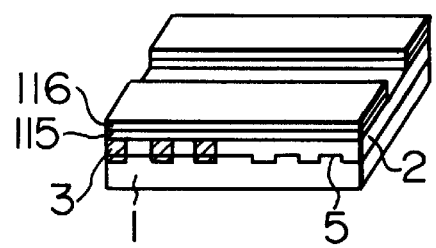
Figure 10D:
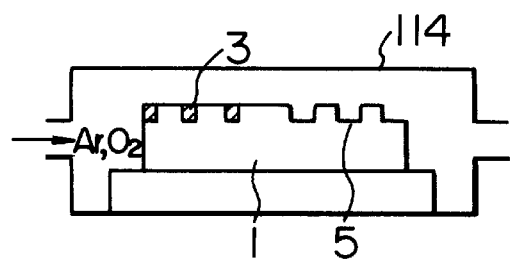

As shown in FIG. 10D, heat treatment is carried out in a diffusion furnace 114 and the polarization inversion portion 3 having a thickness of approximately 0.5 $\mu$m is formed. In order to prevent diffusion of $Li_2O$ to the outside during heat treatment, argon gas Ar passed through warm water heated to 80° C. and oxygen gas $O_2$ are used as the atmosphere of the diffusion furnace 114. Heat treatment condition of 1070° C. and 45 minutes is used.

By conducting ion injection at the room temperature to form the Ti film 111 and then conducting heat treatment, the precision of the polarization inversion portion 3 can be further improved. Even if transition metal such as Ta or Cr is used instead of Ti, the same effect is obtained.

The polarization inversion portion 3 can also be fabricated by using the ion exchange method whereby lithium ions in $LiNbO_3$ are replaced by alkali ions such as H, Na, K, Rb, or Cs.

The polarization inversion portion 3 may be fabricated by using the proton exchange method.

In the proton exchange method, a Cr film of 100 nm is formed on the substrate 1 by sputtering. By using the conventional photolithography technique and etching technique, the Cr film is patterned.

Then, in the area of the diffraction grating 5, a Cr film of 100 nm is formed and its proton exchange is prevented. In a quartz vessel containing heated and fused benzoic acid powder, the substrate 1 is immersed and proton exchange processing is conducted. A proton exchange layer having a depth of approximately 0.1 $\mu$m is thus formed.

At this time, the processing temperature and processing time have been set to 200° C. and 15 minutes, respectively. So long as the processing temperature is within a range from 150° C. to 220° C., however, there is no problem. If the temperature is within a range from 200° C. to 220° C., the proton exchange speed can be increased. The processing temperature of 220° C. or up is not desirable because the substrate surface becomes rough in the succeeding heat treatment process.

If lithium benzoate of 0.1 to 5 mol % is added to benzoic acid, the proton exchange speed can be freely changed.

Then the substrate is cooled, and thereafter the substrate is subjected to ultrasonic cleaning to remove the Cr film.

In the same way as FIG. 10B, the polarization inversion portion 3 is covered by a photomask. The $LiNbO_3$ substrate is etched by 0.1 $\mu$m ion milling.

Finally, the above described photoresist is removed and the Cr film is removed by etching. Heat treatment at 1030° C. is conducted in the heat treatment furnace for 15 minutes, and the polarization inversion portion 3 having a depth of approximately 1 μm is formed.

After the polarization inversion portion 3 has been formed on the substrate 1 by using the above described methods, i.e., the methods of FIGS. 10A–10D, the ion exchange method, or proton exchange method, the process shown in FIG. 10E is started. Referring to FIG. 10E, a monocrystalline thin film liquid layer 2 is formed on the substrate 1, on which the polarization inversion grating 3 has been formed, by means of epitaxial growth.

The fused matter for this liquid epitaxial growth is fabricated by using $LiNbO_3$ of 20 mol %, which is the material of the optical waveguide 4, and the flux material of lithium borate $Li_2B_2O_4$ of 80 mol % as the raw material, sufficiently mixing this with powder of lithium carbonate $Li_2CO_3$, boric acid $H_3BO_3$, niobium pentoxide $Nb_2O_5$, and magnesium oxide MgO, placing the mixture in a platinum crucible, and heating it in an electric furnace having an atmosphere of oxygen and steam at 1200° C. for three hours.

Then, this fused matter is cooled to 800° C. at a cooling speed of 30° C./h, and a Z-cut $LiNbO_3$ monocrystalline substrate 1 doped with 5 mol % of MgO having a +c face polished by optical polishing is immersed in the fused matter.

The substrate 1 is then taken out and gradually cooled in the electric furnace to the room temperature at a cooling speed of 30° C./h. As a result, a $LiNbO_3$ thin film 2 doped with 1 mol % of MgO having a thickness of 2.5 μm is formed on the substrate 1 by epitaxial growth.

The polarization inversion portion 3 formed by the process of FIG. 10D is printed-through on the thin film 2. A rectangular polarization inversion portion 3 having a high aspect ratio is thus formed.

The quantity of addition of the above described flux material is desired to be in a range of 70 to 90 mol %. The immersion time is 10 to 30 minutes for the film thickness of 0.5 to 3 μm. As the flux material, lithium fluoride LiF, potassium fluoride KF, or vanadium pentoxide $V_2O_5$ may also be used besides lithium borate.

Then the thin film 2 is annealed in the atmosphere of oxygen containing steam to make up a loss of oxygen.

Thereafter, the optical waveguide 4 is fabricated.

First of all, a Ta film 115 of 100 nm is formed on the thin film 2 by sputtering as shown in FIG. 10F. On that Ta film 115, a photoresist 116 is applied. By using a photomask 117 having opening in the portion of the optical waveguide 4, the photoresist 116 is patterned.

Thereafter, as shown in FIG. 10G, the Ta film 115 is etched by using the photoresist 116 as a mask and by means of reactive ion etching to form grooves having a width of 3 μm.

Then the photoresist 116 is removed, and the optical waveguide 4 is formed by the proton exchange method which is identical with that described above. As for benzoic acid, however, lithium benzoate of 1 mol % is added to it, and heat treatment is conducted with heat treatment temperature of 220° C. for 15 minutes.

Then, the substrate 1 is cooled, and thereafter Ta 115 is removed by ultrasonic cleaning in sodium hydroxide. Annealing is carried out in the air at 400° C. for 45 minutes and the optical waveguide 4 is fabricated.

If the annealing temperature becomes 425° C. or up, the proton exchange waveguide 4 disappears as a result of pyrolysis. If the annealing temperature is 370° C. or below, the heat treatment temperature becomes long and the light propagation loss increases. As the annealing condition, the range of 370° to 425° C. and 30 to 60 minutes is desirable.

Figure 10H:
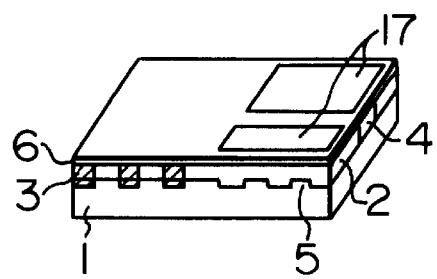

Finally, an $SiO_2$ thin film having a thickness of approximately 0.1 μm is deposited as the guard layer 6 as shown in FIG. 10H by using the plasma CVD method.

Ti: sapphire laser light having a wavelength of 830 nm polarized in a direction perpendicular to the substrate surface was inputted to the optical waveguide thus fabricated, and light propagation loss was measured. As a result, a satisfactory value of 0.5 dB/cm was obtained.

The reason was that the thin film 2 having a quality extremely close to the stoichiometric composition could be made to grow by liquid epitaxial growth and the propagation loss of the optical waveguide 4 was reduced by the proton exchange method.

Thereafter, an Al film having a predetermined film thickness is formed by using the evaporation method or sputtering method. Electrodes 17 are formed by using the photolithography technique and etching technique. A device is cut out. The face perpendicular to the optical waveguide is polished optically.

Finally, the coating film 12 transmitting the fundamental wave and reflecting the second harmonic is disposed in the end face of the polarization inversion portion 3. In addition, the coating film 13 transmitting the second harmonic is disposed in the end face of the diffraction grating 5. The device is mounted in the holder 16. In the same way, the semiconductor laser 7 is mounted. Wiring is conducted. Other components are also mounted. The optical axis is adjusted, and the collimating lens 14 is fixed. The waveguide SHG light source of internal resonance type has thus been completed.

Embodiment 8

The present embodiment aims at raising the efficiency by making the sectional shape of the periodic polarization inversion grating of the second harmonic generation device closely resemble a rectangle.

For this purpose, a structure as shown in FIGS. 11A and 11B is considered. On the +c face of a substrate 51, an optical waveguide layer 53 of ridge type is disposed. In the optical waveguide layer 53, a portion 57 having upward spontaneous polarization and a portion (polarization inversion area) 58 having downward spontaneous polarization are periodically disposed. A similar configuration may also be formed on the −c face. Numeral 56 denotes a polarization inversion portion disposed in the substrate to form the above described polarization inversion area. The portion 56 has an inverted polarization direction with respect to the substrate. The polarization inversion portion 56 is formed by using the Ti diffusion, ion exchange, electron-beam lithography method, or direct electric field application (poling) method, for example. The optical waveguide layer 53 can be formed by using a vapor growth method such as the liquid epitaxial growth method or sputtering, or a solid phase growth method such as epitaxial growth by melting.

A method for forming the above described polarization inversion area 58 having a shape closely resembling a rectangle will now be described.

Figure 13:
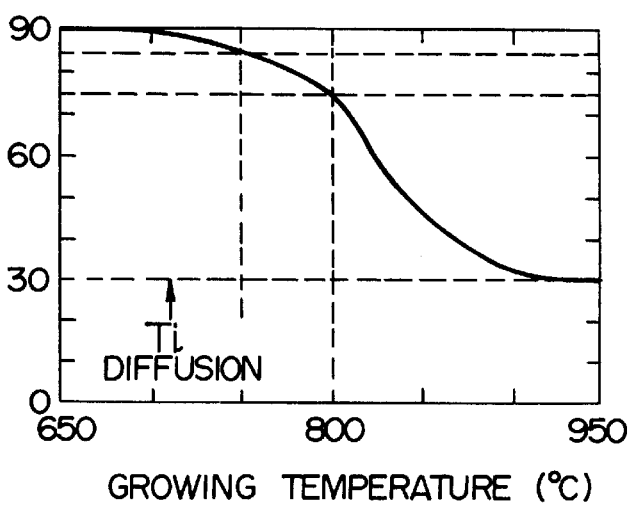
FIG. 13 is a graphic diagram showing the relation between the shape of a polarization inversion portion and film growth temperature.

In the present embodiment, the polarization inversion portion 56 is disposed on the substrate 51, and then the optical waveguide layer 53 is formed. As shown in FIG. 13, the shape of the polarization inversion area 58 depends upon the film growth temperature. For a temperature up to 800° C., the periodic inversion boundary line of polarization in the optical waveguide layer forms an angle of 75° to 105° with the boundary line between the substrate and the optical waveguide layer. For a temperature up to 750° C., the periodic inversion boundary line of polarization in the optical waveguide layer forms an angle of 85° to 95° with the boundary line between the substrate and the optical waveguide layer. As understood from FIG. 13, the shape of the polarization inversion area 58 abruptly resembles a triangular shape obtained by Ti diffusion for 800° C. or a higher temperature.

As heretofore described, the optical waveguide layer 53 including a periodic polarization inversion grating having a rectangular or nearly rectangular sectional shape as shown in FIGS. 11A and 11B can be formed.

The second harmonic generation device in the above described embodiment can be fabricated by using a combination of materials.

For example, the substrate is made of lithium niobate doped with magnesium oxide, and the optical waveguide layer is made of lithium niobate or lithium niobate having a lower magnesium content as compared with the substrate. Alternatively, the substrate may be made of lithium tantalum niobate, and the optical waveguide layer may be made of lithium tantalum niobate having a higher niobium content as compared with the substrate. Further alternatively, the substrate may be made of potassium titanyl phosphate or potassium titanate arsenic phosphate, and the optical waveguide layer may be made of potassium titanate arsenate or potassium titanate arsenic phosphate having a higher arsenic content as compared with the substrate.

Alternatively, the substrate may be made of potassium titanyl phosphate or rubidium potassium titanate phosphate, and the optical waveguide layer may be made of rubidium titanate phosphate or rubidium potassium titanate phosphate having a higher rubidium content as compared with the substrate.

For light having a wavelength of 633 nm, for example, the extraordinary light refractive index of lithium niobate of the above described substrate is 2.203 in the commercially available congruent composition, for example. The extraordinary light refractive index of lithium niobate doped with 5 mol % of magnesium oxide is 2.192. (See H. Tamada, Journal of Applied Physics, Vol. 70, No. 5, (1991) pp. 2536–2541.) For light with a wavelength of 633 nm, the extraordinary light refractive index of lithium tantalate is 2.180. (See Hiroshi Nishihara, "Optical Integrated Circuit", p. 178.)

Furthermore, it is known that the extraordinary light refractive index of lithium tantalum niobate increases monotonously with the niobium content. (See NTT technique transfer corporation, "Study on quality improvement of oxide ferroelectric crystal", Chapter 3.)

Both lithium niobate and lithium tantalate are special cases of lithium tantalum niobate.

In the same way, the refractive index of potassium titanate arsenic phosphate increases with the arsenic content. There is reported an example in which an optical waveguide layer of potassium titanate arsenate is formed on a substrate of potassium titanate arsenic phosphate by means of liquid epitaxial growth to use this relation. (See L. K. Cheng etc., Journal of Crystal Growth, Vol. 112 (1991) pp. 309–315.)

Both potassium titanyl phosphate and potassium titanate arsenate are special cases of potassium titanate arsenic phosphate.

In the same way, the refractive index of rubidium potassium titanate phosphate increases with the rubidium content. There is reported an example in which an optical waveguide layer is formed by exchanging a part of potassium ions of potassium titanyl phosphate with rubidium ions. (J. D. Bierlein etc., Proceedings of Conference on Lasers and Electro-Optics (1991) CMH13.)

Both potassium titanyl phosphate and rubidium titanate phosphate are special cases of rubidium potassium titanate phosphate.

FIGS. 12A–12G are production process diagrams showing a method for fabricating the above described second harmonic generation device by using the liquid epitaxial growth method and ion milling.

Figure 12A:
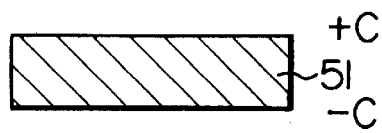
FIGS. 12A–12G show production processes of a second harmonic generation device according to the present invention.

First of all, a $LiNbO_3$ substrate 51 doped with 5 mol % of MgO having an optically polished +c face as shown in FIG. 12A is subjected to ultrasonic cleaning in acetone and pure water and quickly dried.

Figure 12E:
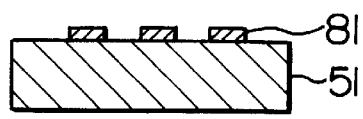
Figure 12B:
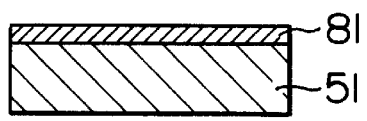

Thereafter, a Ti film 81 having a thickness of 30 Å is formed on the +c face by sputtering as shown in FIG. 12B.

Figure 12F:
Figure 12C:
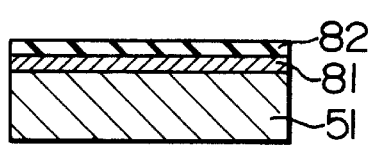
Figure 12G:
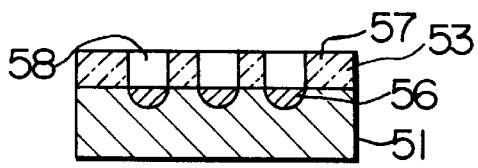
Figure 12D:
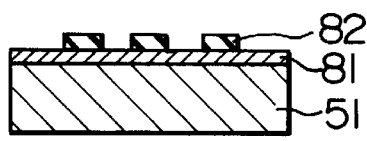

As shown in FIG. 12C, a photoresist 82 is then applied onto the Ti film 81 by a spinner. Patterning of the photoresist 82 is conducted by using a photomask having openings corresponding to the polarization inversion portions 56 (FIG. 12D).

With the above described photoresist used as a mask, the Ti film 81 is patterned by RIE using $CF_3Cl$ gas. The photoresist 82 is removed (FIG. 12E). The pattern period of the photomask is made equal to 1 to 10 μm so as to match with the period of the generated SHG light.

Then the substrate is placed in a diffusion furnace and passed through a hot water bubbler of approximately 80° C. In the atmosphere of Ar containing steam, the substrate is thus subjected to heat treatment at approximately 1100° C. for approximately 10 minutes. At the time of cooling, the atmosphere is changed to oxygen $O_2$ containing steam. Thereby, polarization inversion portions 56 are formed on the +c surface of the substrate 51 as shown in FIG. 12F.

On the +c face of the substrate 51, an optical waveguide layer 53 made of a $LiNbO_3$ monocrystalline thin film is then formed by using the liquid epitaxial crystal growth method.

As for the fused matter at the time of the above described epitaxial growth, powder of lithium carbonate of 50.0 mol %, powder of niobium pentoxide of 2.5% mol %, and powder of vanadium pentoxide $V_2O_5$ of 47.5 mol % are weighed and mixed as raw materials. The mixture is placed in a platinum crucible and melted at 900° C.

Then the fused matter is kept at a temperature of 1200° C. in an air atmosphere in an electric furnace for 10 hours. Thereafter, this fused matter is cooled to 72° C. at a cooling speed of 50° C. and agitated at 60 rpm for 3 hours by using a Pt agitator. The fused matter is thus made uniform.

Thereafter, this fused matter is cooled to 690° C. at a cooling speed of 30° C./h. In this fused matter, the substrate as shown in FIG. 12F is brought into contact with it for 33 minutes. As a result, an optical waveguide layer 53 of a $LiNbO_3$ thin film having a film thickness of 3 μm as shown in FIG. 12G grows on the substrate.

Thereafter, the above described sample is gradually to the room temperature in the electric furnace at a cooling speed of 30° C./h.

In case the optical waveguide layer 53 is made of lithium niobate, lithium niobate doped with magnesium oxide, or lithium tantalum niobate, flux used for liquid epitaxial growth of the optical waveguide may be made of boron trioxide, lithium fluoride, potassium fluoride, vanadium pentoxide and potassium oxide, vanadium pentoxide and sodium oxide, boron trioxide and molybdenum trioxide, or boron trioxide and tungsten trioxide instead of the above described vanadium pentoxide.

In case the above described optical waveguide layer 53 is made of potassium titanate arsenic phosphate, potassium titanate arsenate, rubidium potassium titanate phosphate, or rubidium titanate phosphate, flux used for liquid epitaxial growth may be made of tungsten trioxide, molybdenum trioxide, or potassium arsenic phosphate.

Areas of this optical waveguide layer 53 (monocrystalline thin film) and the substrate 51 were etched by using etching solution having composition represented as nitric acid : fluoric acid =1:1. Irrespective of the period Λ, the direction of the polarization in the portions 57 and 58 was identical to the direction of of the polarization in the corresponding portion of the substrate 51. The interface between the portions 57 and 58 was nearly perpendicular to the interface between the optical waveguide layer 53 and the substrate 51 (FIG. 12G).

Finally, a channel portion was fabricated. A photoresist was first subjected to patterning by using a photomask in which only the channel portion became a light shading portion. By using this photoresist as the mask and by means of ion milling, a thin film was etched by 2 μm. The channel width was 3 μm. Thereafter, the photoresist was removed and the channel portion was fabricated. The ion milling device used in the present production process has a plasma chamber, which has such a structure that a plurality of permanent magnets are disposed in the periphery of a conical cavity vacuum vessel. The plasma chamber also has such a structure that ions generated by a plasma generation chamber are pulled out by a set of three electrodes, i.e., an acceleration electrode, a deceleration electrode, and a ground electrode. Therefore, spatial density distribution of ions is uniform, and directivity is extremely high. Etching with extremely high precision is thus possible.

In case the optical waveguide layer is made of the above described lithium niobate, lithium niobate doped with magnesium oxide, or lithium tantalum niobate, the above described channel portion can be fabricated as a load type by sputtering ZnO or $SiO_2$, for example, on the optical waveguide layer to form a film or as a buried type by means of proton exchange.

In case the optical waveguide layer is made of potassium titanate arsenic phosphate, potassium titanate arsenate, rubidium potassium titanate phosphate, or rubidium titanate phosphate, the channel portion can be fabricated as a load type by sputtering $SiO_2$, for example, on the optical waveguide layer to form a film or as a buried type by means of ion exchange of Rb, Ti or the like.

For light having a wavelength of 830 nm, light propagation loss of the optical waveguide fabricated by the above described production process was measured by using the cutback method. As a result, a satisfactory value of 0.5 dB/cm was obtained.

The sample was cut with the optical waveguide length=10 mm and a vertical length of 5 mm. The vertical side was subjected to optical polishing and an experiment of second harmonic generation was made.

In the above described experiment, titanium—sapphire laser light 11 was focused on the end face of the channel portion by an object lens 12. A sample was placed on a copper block connected to a Peltier device. Its temperature was monitored by using a thermocouple. First of all, the wavelength of the laser light source was set so that the generation efficiency of the second harmonic would be maximized at a temperature of 25° C.

As a result, a second harmonic output of 4 mW was obtained when the fundamental wave input was 40 mW. With due regard to the Fresnel reflection loss, the efficiency was 11.8%. This value is sufficiently high as compared with values of conventional techniques.

Furthermore, it is estimated from the above described result that the generation efficiency of the second harmonic becomes 30% and a second harmonic output of 30 mW is obtained when a high output semiconductor laser having an output of 200 mW is coupled to the optical waveguide with a coupling efficiency of 50%. It is understood that the device can be sufficiently used as a light source for writing and reproducing operation of optical magnetic disks and phase change optical disks.

In accordance with the present embodiment, domains of the substrate periodically inverted in polarization are printed by using the LPE method, and periodic spontaneous polarization inversion domains having a rectangular section are formed in the optical waveguide. Thereby, a second harmonic generation device having a high conversion efficiency can be fabricated.

Embodiment 9

FIG. 14 shows an example of application of the present invention. In the application, the light source of the embodiment already described is used for recording and reproducing operation of an optical disk.

In FIG. 14, numeral 141 denotes direct current voltage applying means, 142 a light source according to the present invention, 143 a second harmonic collimating lens, 144 a beam splitter, 145 a mirror, 146 an object lens, 147 an optical disk, and 148 a photodetector.

By a signal to be recorded on the optical disk 147, i.e., a signal supplied from the direct current voltage applying means 141, the light source 142 of the present invention is modulated. As described for the first embodiment, modulation is performed by applying a predetermined voltage according to the signal, changing the oscillation frequency of the laser light source, and forcibly violating the phase matching condition.

The light beam emitted from the end face of the waveguide 4 and modulated is passed through the second harmonic collimating lens 143, beam splitter 144, mirror 145, and object lens 146 and formed as a spot. A train of pits is thus formed on the optical disk 147 according to the modulation signal. When this is to be reproduced, an optical power lower than that used in the recording operation is used. Light reflected from the disk 147 is branched by the beam splitter 144 and received by the photodetector 148. The original modulation signal is thus demodulated.

Embodiment 10

FIG. 15 shows another example of application of the present invention. In the application, the light source of the already described embodiment is used as a light source for a laser beam printer.

In FIG. 15, numeral 151 denotes a rotating polygon mirror, 152 a photosensitive drum, 141 direct current applying means, 142 a light source according to the present invention, 143 a second harmonic collimating lens, and 146 an object lens.

The collimated light is focused by the collimating lens 143. The light beam is swung to the left and right by the rotating polygon mirror 151. A spot is formed on the photosensitive drum 152 by the scan lens 146. By the modulation signal, a latent image formed on the photosensitive drum 152 is covered by toner, printed to paper, and recorded.

In the present invention heretofore described, the diffraction grating is added to the polarization inversion portion, and the second harmonic generation portion can be separated from the fundamental wave reflecting portion. Therefore, each of the second harmonic generation portion and the fundamental wave reflecting portion can be designed in an optimum manner. Furthermore, since the oscillation frequency of the semiconductor laser is controlled by the voltage applied to the electrodes, it is possible to tune the oscillation frequency of the semiconductor laser to the second harmonic generation frequency, or on the contrary directly modulate the second harmonic light. Furthermore, with the increase in output of the semiconductor laser, the generation efficiency of the second harmonic can be markedly increased as compared with the conventional method.

We claim:

1. A harmonic modulation device of waveguide type comprising:

a semiconductor laser;

a waveguide for generating a nonlinear optical harmonic of said semiconductor laser by keeping phase matching;

means for leading an optical beam of said semiconductor laser to said waveguide;

electrodes disposed on said waveguide; and means for modulating a refractive index of said waveguide electro-optically to modulate a phase matching condition and thereby modulate an intensity of said harmonic.

2. A harmonic modulation device of waveguide type according to claim 1, wherein said phase matching is pseudomatching of phase, and a sign of an electric field applied to said electrodes is associated with a periodically inverted sign of a nonlinear optical constant in each of equidistant portions forming a waveguide of phase pseudomatching type.

3. A harmonic modulation device of waveguide type according to claim 1, wherein said phase matching is pseudomatching, of phase in which the sign of the nonlinear optical constant is inverted in periodic portions having unequal intervals.

4. A harmonic modulation device of waveguide type according to claim 1, wherein said phase matching is achieved by a periodic repetition of a plurality of areas having different refractive indexes, and said electrodes are disposed in parallel to said waveguide.

5. A harmonic modulation device of waveguide type according to claim 1, wherein said phase matching is achieved by forming areas having nonlinear optical constants periodically decreased, and said electrodes are disposed in parallel to said waveguide.

6. A harmonic modulation device of waveguide type according to claim 1, wherein said phase matching is achieved by making an effective refractive index of the fundamental wave coincident with that of a second harmonic, and said electrodes are disposed in parallel to said waveguide.

7. A harmonic modulation device for receiving an incident semiconductor laser light and outputting a higher harmonic of said laser light, comprising:

a substrate including a plurality of domains having different nonlinear optical constants; and a plurality of electrodes for applying electric fields to said domains to establish a pseudo-phasematching condition during output of said higher harmonic of said laser light.

8. A harmonic modulation device according to claim 7, wherein said electrodes apply electric fields having opposite signs to adjacent ones of said domains.

9. A harmonic modulation device according to claim 8, wherein different ones of said electrodes apply said electric fields having opposite signs to said adjacent domains.

10. A harmonic modulation device according to claim 9, wherein said electrodes are comb electrodes.

11. A harmonic modulation device according to claim 7, wherein said electrodes apply electric fields having the same sign to adjacent ones of said domains.

12. A harmonic modulation device according to claim 11, wherein said adjacent domains have sizes which are different from each other.

13. A waveguide SHG light source of internal resonance type for inputting a fundamental wave component of semiconductor laser light to an optical waveguide including, in an optical substrate having spontaneous polarization, a polarization inversion portion having a periodically inverted direction of spontaneous polarization and for converting said fundamental wave component to a second harmonic, said SHG light source comprising:

a diffraction grating disposed in the optical waveguide of the second harmonic output side of said polarization inversion portion to reflect said fundamental wave component of the semiconductor laser light toward said semiconductor laser; and a pair of electrodes disposed on said diffraction grating to adjust a refractive index of said optical waveguide by applying a direct current voltage through an optical transparent thin film.

14. A waveguide SHG light source of internal resonance type for inputting a fundamental wave component of semiconductor laser light to an optical waveguide including, in an optical substrate having spontaneous polarization, a polarization inversion portion having a periodically inverted direction of spontaneous polarization and for converting said fundamental wave component to a second harmonic, said SHG light source comprising:

a diffraction grating disposed in the optical waveguide of the second harmonic output side of said polarization inversion portion to reflect said fundamental wave component of the semiconductor laser light toward said semiconductor laser;

a pair of electrodes disposed on said diffraction grating to adjust a refractive index of said optical waveguide by applying a direct current voltage through an optical transparent thin film;

means disposed in an end face of said optical substrate for inputting said semiconductor laser light or between said optical substrate and said semiconductor laser to transmit only the fundamental wave of said semiconductor laser light and reflect the second harmonic of said semiconductor laser light; and means for reflecting the fundamental wave of said semiconductor laser light, said reflecting means being disposed in an end face of said optical substrate opposite to said end face for inputting said semiconductor laser light.

15. A waveguide SHG light source of internal resonance type according to claim 14, wherein said diffraction grating is disposed, not in the optical waveguide of the second harmonic output side of the polarization inversion portion, but in the optical waveguide of the second harmonic output side of a refractive index modulation portion including a periodic repetition of a plurality of areas having different refractive indexes in the optical substrate.

16. A waveguide SHG light source of internal resonance type according to claim 14, wherein said diffraction grating is disposed, not in the optical waveguide of the second harmonic output side of the polarization inversion portion, but in the optical waveguide of the second harmonic output side of a spontaneous polarization modulation portion having a periodically modulated spontaneous polarization magnitude.

17. A waveguide SHG light source of internal resonance type according to claim 14, wherein said optical substrate is formed by using lithium niobate ($LiNbO_3$), lithium niobate dosed with magnesium oxide ($LiNbO_3:MgO$) lithium tantalum niobate ($LiTaNbO_3$), or lithium tantalate ($LiTaO_3$).

18. A waveguide SHG light source of internal resonance type according to claim 14, wherein said optical waveguide is disposed in a ferroelectric thin film having the same spontaneous polarization direction as the optical substrate, and said diffraction grating has a periodically etched structure.

19. A waveguide SHG light source of internal resonance type according to claim 14, wherein means for reflecting said semiconductor laser light is disposed in an end face of said semiconductor laser opposite to said optical substrate.

20. A waveguide SHG light source of internal resonance type according to claim 14, wherein said polarization inversion portion and said diffraction grating have the same grating period, and a pair of electrodes disposed on said diffraction grating are disposed in parallel to a direction of light propagation in the optical waveguide.

21. A waveguide SHG light source of internal resonance type according to claim 14, wherein an electric field obtained by applying a voltage between said pair of electrodes controls a refractive index of the diffraction grating located under said electrodes to make a Bragg wavelength of said diffraction grating coincident with a wavelength of SH light oscillated by a polarization inversion grating.

22. A waveguide SHG light source of internal resonance type according to claim 14, wherein an electric field obtained by applying a voltage between said pair of electrodes controls a refractive index of the diffraction grating, which is located under said electrodes, to deviate a Bragg wavelength of said diffraction grating from a wavelength of SH light oscillated by a polarization inversion grating and thereby modulate an intensity of the outputted second harmonic.

23. A second harmonic generation device of waveguide type comprising:
   an optical substrate; and
   a ferroelectric optical waveguide layer having periodically arranged polarization inversion areas, periodic inversion boundary lines of polarization in the optical waveguide layer making an angle of 75°–105° with a surface or interface of said optical waveguide layer;
   wherein said substrate comprises lithium niobate ($LiNbO_3$) doped with magnesium oxide, and the optical waveguide layer comprises lithium niobate or lithium niobate doped with a smaller amount of magnesium oxide as compared with the substrate.

24. A second harmonic generation device of waveguide type according to claim 23, wherein said periodic inversion boundary lines of polarization in the optical waveguide layer make an angle of 85°–95 with the surface or interface of said optical waveguide layer.

25. A second harmonic generation device of waveguide type according to claim 23, further comprising a cladding layer having a refractive index lower than that of said optical waveguide layer and having a width narrower than that of said optical waveguide layer disposed on said optical waveguide layer.

26. A method for manufacturing a second harmonic generation device of waveguide type including a ferroelectric optical waveguide layer having periodically arranged polarization inversion areas, said method comprising at least the steps of:

forming polarization inversion portions periodically on a substrate; and forming an optical waveguide layer on said substrate by using liquid epitaxial growth;

wherein said liquid epitaxial growth has a film growth temperature of 800° C. or below.

27. A second harmonic generation device of waveguide type comprising:
   an optical substrate; and
   a ferroelectric optical waveguide layer having periodically arranged polarization inversion areas, periodic inversion boundary lines of polarization in the optical waveguide layer making an angle of 75°–105° with a surface or interface of said optical waveguide layer;
   wherein said substrate comprises lithium tantalum niobate ($LiTa_xNb_{1-x}O_3; 0 \leq x \leq 1$), and said optical waveguide layer comprises lithium niobate or lithium tantalum niobate having a higher niobium content as compared with said substrate.

28. A second harmonic generation device of waveguide type according to claim 27, further comprising a cladding layer having a refractive index lower than that of said optical waveguide layer and having a width narrower than that of said optical waveguide layer disposed on said optical waveguide layer, wherein said cladding layer comprises ZnO or $SiO_2$.

29. A second harmonic generation device of waveguide type comprising:
   an optical substrate; and
   a ferroelectric optical waveguide layer having periodically arranged polarization inversion areas, periodic inversion boundary lines of polarization in the optical waveguide layer making an angle of 75°–105° with a surface or interface of said optical waveguide layer;
   wherein said substrate comprises potassium titanate phosphate ($KTiOPO_4$) or potassium titanate arsenic phosphate ($KTioAs_xP_{1-x}O_4$; $0 \leq x \leq 1$), and said optical waveguide layer comprises potassium titanate arsenate ($KTiOAsO_4$) or potassium titanate arsenic phosphate having a higher arsenic content as compared with said substrate.

30. A second harmonic generation device of waveguide type comprising:
   an optical substrate; and
   a ferroelectric optical waveguide layer having periodically arranged polarization inversion areas, periodic inversion boundary lines of polarization in the optical waveguide layer making an angle of 75°–105° with a surface or interface of said optical waveguide layer;
   wherein said substrate comprises potassium titanate phosphate ($KTiOPO_4$) or rubidium potassium titanate phosphate ($Rb_xK_{1-x}TiOPO_4$; $0 \leq x \leq 1$), and said optical waveguide layer comprises rubidium titanate phosphate ($RbTiOPO_4$) or rubidium potassium titanate phosphate having a higher rubidium content as compared with said substrate.

31. A second harmonic generation device of waveguide type according to claim 30, further comprising a cladding layer having a refractive index lower than that of said optical waveguide layer and having a width narrower than that of said optical waveguide layer disposed on said optical waveguide layer, wherein said cladding layer comprises $SiO_2$.

32. A method for manufacturing a second harmonic generation device of waveguide type including a ferroelectric optical waveguide layer having periodically arranged polarization inversion areas, said method comprising at least the steps of:

forming polarization inversion portions periodically on a substrate; and forming an optical waveguide layer on said substrate by using liquid epitaxial growth;

wherein said liquid epitaxial growth has a film growth temperature of 750° C. or below.

33. A method for manufacturing a second harmonic generation device of waveguide type according to claim 32, wherein said optical waveguide layer comprises lithium niobate doped with magnesium oxide, lithium niobate, or lithium tantalum niobate, and flux used for liquid epitaxial growth comprises vanadium pentoxide ($V_2O_5$), boron trioxide ($B_2O_3$), lithium fluoride (LiF), potassium fluoride (KF), vanadium pentoxide ($V_2O_5$) and potassium oxide ($K_2O$), vanadium pentoxide ($V_2O_5$) and sodium oxide ($Na_2O$), boron trioxide ($B_2O_3$) and molybdenum trioxide ($MoO_3$), or boron trioxide ($B_2O_3$) and tungsten trioxide ($WOP_3$).

34. A method for manufacturing a second harmonic generation device of waveguide type according to claim 32, wherein said optical waveguide layer comprises potassium titanate arsenic phosphate, potassium titanate arsenate, rubidium potassium titanate phosphate, or rubidium titanate phosphate, and flux used for liquid epitaxial growth comprises tungsten trioxide ($WO_3$), molybdenum trioxide ($MoO_3$), or potassium arsenic phosphate ($KAs_xP_{1-x}O_4; 0 \leq x \leq 1$).

* * * * *